US011830831B2

(12) United States Patent
Dogiamis et al.

(10) Patent No.: US 11,830,831 B2
(45) Date of Patent: Nov. 28, 2023

(54) SEMICONDUCTOR PACKAGE INCLUDING A MODULAR SIDE RADIATING WAVEGUIDE LAUNCHER

(71) Applicant: INTEL CORPORATION, Santa Clara, CA (US)

(72) Inventors: Georgios Dogiamis, Chandler, AZ (US); Sasha Oster, Chandler, AZ (US); Johanna Swan, Scottsdale, AZ (US); Shawna Liff, Scottsdale, AZ (US); Adel Elsherbini, Chandler, AZ (US); Telesphor Kamgaing, Chandler, AZ (US); Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1086 days.

(21) Appl. No.: 16/327,810

(22) PCT Filed: Sep. 23, 2016

(86) PCT No.: PCT/US2016/053491
§ 371 (c)(1),
(2) Date: Feb. 23, 2019

(87) PCT Pub. No.: WO2018/057006
PCT Pub. Date: Mar. 29, 2018

(65) Prior Publication Data
US 2021/0265288 A1 Aug. 26, 2021

(51) Int. Cl.
*H01L 23/66* (2006.01)
*H01P 3/12* (2006.01)

(52) U.S. Cl.
CPC .............. *H01L 23/66* (2013.01); *H01P 3/121* (2013.01); *H01L 2223/6627* (2013.01)

(58) Field of Classification Search
CPC ......... H01P 3/121; H01P 5/107; H01Q 13/02; H01Q 21/064; H01L 23/66; H01L 2223/6627
See application file for complete search history.

(56) References Cited

U.S. PATENT DOCUMENTS

| 5,545,924 A | 8/1996 | Contolatis et al. |
| 9,960,849 B1 | 5/2018 | Dogiamis et al. |
| (Continued) | | |

FOREIGN PATENT DOCUMENTS

| JP | 2007-235563 A | 9/2007 |
| WO | 2012-040376 A1 | 3/2012 |
| (Continued) | | |

OTHER PUBLICATIONS

U.S. Office Action from related U.S. Appl. No. 16/328,532, dated Apr. 3, 2020.
(Continued)

*Primary Examiner* — Brigitte A Paterson
(74) *Attorney, Agent, or Firm* — Schwabe, Williamson & Wyatt, P.C.

(57) ABSTRACT

Integration of a side-radiating waveguide launcher system into a semiconductor package beneficially permits the coupling of a waveguide directly to the semiconductor package. Included are a first conductive member and a second conductive member separated by a dielectric material. Also included is a conductive structure, such as a plurality of vias, that conductively couples the first conductive member and the second conductive member. Together, the first conductive member, the second conductive member, and the conductive structure form an electrically conductive side-radiating waveguide launcher enclosing shaped space within the dielectric material. The shaped space includes a narrow first end and a wide second end. An RF excitation element is disposed proximate the first end and a waveguide may be (Continued)

operably coupled proximate the second end of the shaped space.

5 Claims, 13 Drawing Sheets

(56) References Cited

U.S. PATENT DOCUMENTS

| | | |
|---|---|---|
| 2002/0186105 A1 | 12/2002 | Shih et al. |
| 2003/0137465 A1 | 7/2003 | Graczyk et al. |
| 2003/0197572 A1 | 10/2003 | Ammar |
| 2004/0069984 A1 | 4/2004 | Estes et al. |
| 2005/0012199 A1 | 1/2005 | Rosenau et al. |
| 2008/0136689 A1 | 6/2008 | Gonzalez |
| 2008/0160931 A1 | 7/2008 | Rofougaran |
| 2008/0224936 A1 | 9/2008 | Brist et al. |
| 2010/0053026 A1 | 3/2010 | Van Der P. |
| 2010/0134376 A1* | 6/2010 | Margomenos ....... H01Q 21/065 343/860 |
| 2010/0141350 A1* | 6/2010 | Sasaki ................. H05K 1/0207 333/1.1 |
| 2011/0018657 A1 | 1/2011 | Cheng et al. |
| 2013/0082800 A1 | 4/2013 | Rofougaran et al. |
| 2013/0120206 A1 | 5/2013 | Biancotto et al. |
| 2014/0291835 A1 | 10/2014 | Demin et al. |
| 2014/0320231 A1* | 10/2014 | Seler ...................... H01L 24/19 333/26 |
| 2014/0355663 A1 | 12/2014 | Kizer et al. |
| 2015/0029069 A1 | 1/2015 | Roemer et al. |
| 2015/0048471 A1* | 2/2015 | Hasch .................. H01L 23/528 257/664 |
| 2015/0109739 A1 | 4/2015 | Shapiro et al. |
| 2015/0364830 A1 | 12/2015 | Tong et al. |
| 2016/0043455 A1 | 2/2016 | Seler et al. |
| 2016/0142155 A1 | 5/2016 | Kim et al. |
| 2017/0047312 A1 | 2/2017 | Budd et al. |
| 2018/0052281 A1 | 2/2018 | Kuo et al. |
| 2018/0097268 A1 | 4/2018 | Oster et al. |
| 2018/0183561 A1 | 6/2018 | Dogiamis et al. |

FOREIGN PATENT DOCUMENTS

| | | |
|---|---|---|
| WO | 2015-157548 A1 | 10/2015 |
| WO | 2018-057006 A1 | 3/2018 |
| WO | 2018-063238 A1 | 4/2018 |
| WO | 2018-063341 A1 | 4/2018 |
| WO | 2018-063342 A1 | 4/2018 |
| WO | 2018-063362 A1 | 4/2018 |
| WO | 2018-063388 A1 | 4/2018 |
| WO | 2018-125479 A1 | 7/2018 |

OTHER PUBLICATIONS

International Search Report and Written Opinion issued in PCT Application No. PCT/US2016/053491, dated Apr. 25, 2017, 10 pages.
International Preliminary Report on Patentability issued in PCT Application No. PCT/US2016/053491, dated Apr. 4, 2019, 9 pages.
International Search Report and Written Opinion issued in PCT Application No. PCT/US2016/054417, dated Jun. 20, 2017, 9 pages.
International Preliminary Report on Patentability issued in PCT Application No. PCT/US2016/054417, dated Apr. 11, 2019, 8 pages.
International Search Report and Written Opinion issued in PCT Application No. PCT/US2017/063600, dated Mar. 8, 2018, 14 pages.
International Preliminary Report on Patentability issued in PCT Application No. PCT/US2017/063600, dated Jul. 11, 2019, 11 pages.
International Search Report and Written Opinion issued in PCT Application No. PCT/US2016/053463, dated Apr. 25, 2017, 12 pages.
International Preliminary Report on Patentability issued in PCT Application No. PCT/US2016/053463, dated Apr. 4, 2019, 11 pages.
Office Action issued in U.S. Appl. No. 15/394,990, dated Apr. 2, 2018, 17 pages.
Final Office Action issued in U.S. Appl. No. 15/394,990, dated Oct. 4, 2018, 16 pages.
Office Action issued in U.S. Appl. No. 15/394,990, dated Mar. 4, 2019, 17 pages.
Notice of Allowance issued in U.S. Appl. No. 15/394,990, dated Jun. 24, 2019, 10 pages.

* cited by examiner

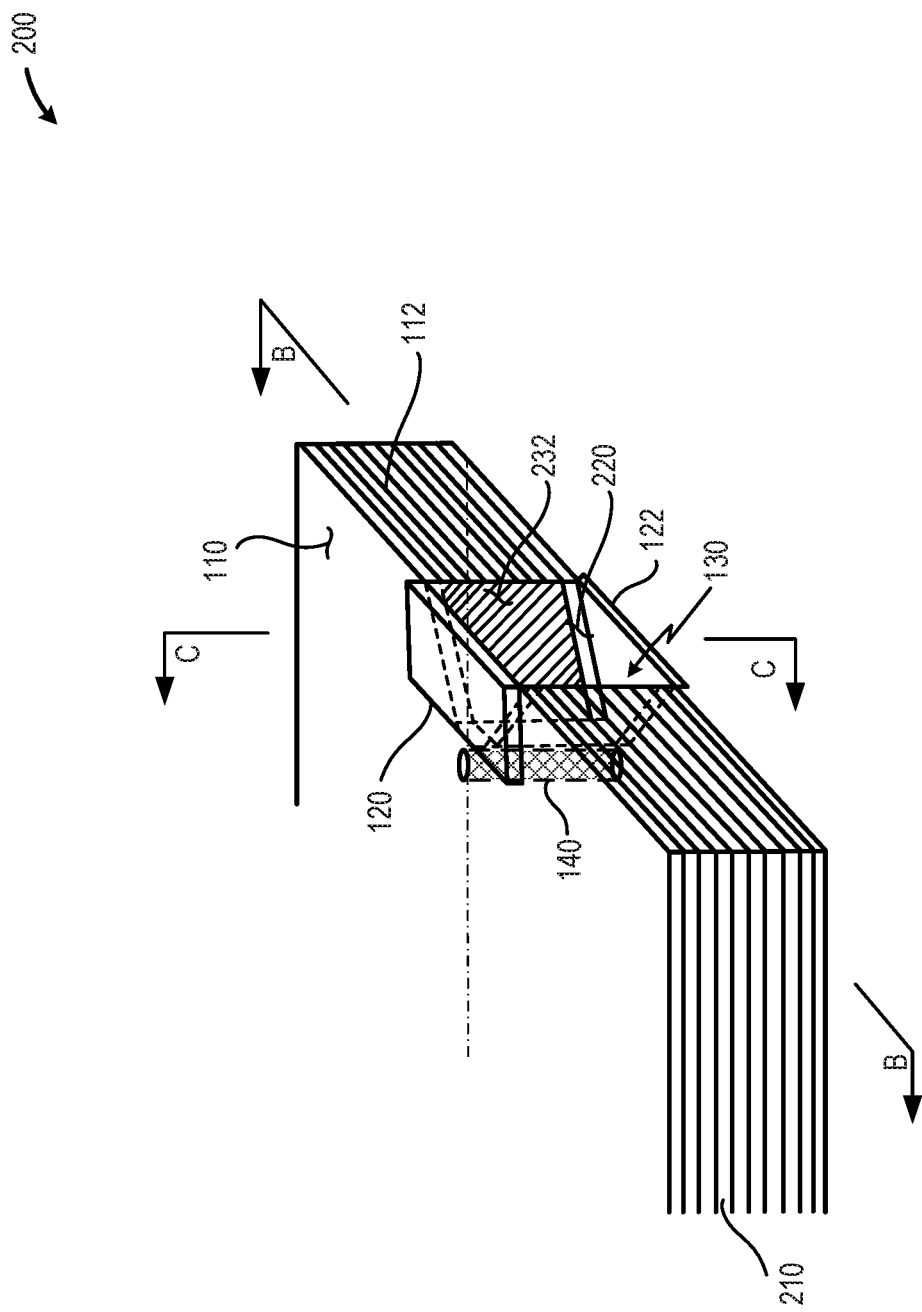

SEMICONDUCTOR PACKAGE INCLUDING A MODULAR SIDE RADIATING WAVEGUIDE LAUNCHER

CROSS-REFERENCE TO RELATED APPLICATIONS

This present application is a National Phase Application Filed Under 35 U.S.C. 371 claiming priority to PCT/US2016/053491 filed Sep. 23, 2016, the entire disclosure of which is incorporated herein by reference.

TECHNICAL FIELD

The present disclosure relates to systems and methods for integrating waveguide launchers into semiconductor packages.

BACKGROUND

As more devices become interconnected and users consume more data, the demand placed on servers accessed by users has increased commensurately and shows no signs of letting up in the near future. Among others, these demands include increased data transfer rates, switching architectures that require longer interconnects, and extremely cost and power competitive solutions.

There are many interconnects within server and high performance computing (HPC) architectures today. These interconnects include within blade interconnects, within rack interconnects, and rack-to-rack or rack-to-switch interconnects. In today's architectures, short interconnects (for example, within rack interconnects and some rack-to-rack) interconnects are achieved with electrical cables—such as Ethernet cables, co-axial cables, or twin-axial cables, depending on the required data rate. For longer distances, optical solutions are employed due to the very long reach and high bandwidth enabled by fiber optic solutions. However, as new architectures emerge, such as 100 Gigabit Ethernet, traditional electrical connections are becoming increasingly expensive and power hungry to support the required data rates. For example, to extend the reach of a cable or the given bandwidth on a cable, higher quality cables may need to be used or advanced equalization, modulation, and/or data correction techniques employed which add power and latency to the system. For some distances and data rates required in proposed architectures, there is no viable electrical solution today. Optical transmission over fiber is capable of supporting the required data rates and distances, but at a severe power and cost penalty, especially for short to medium distances, such as a few meters.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 2A depicts a perspective view of an illustrative semiconductor package integrated side-radiating waveguide launcher system that includes a dielectric medium that includes a plurality of laminated layers disposed between a first conductive member and a second conductive member and a conductive structure that conductively couples the first conductive member with the second conductive member, in accordance with at least one embodiment described herein;

Figure 1A:
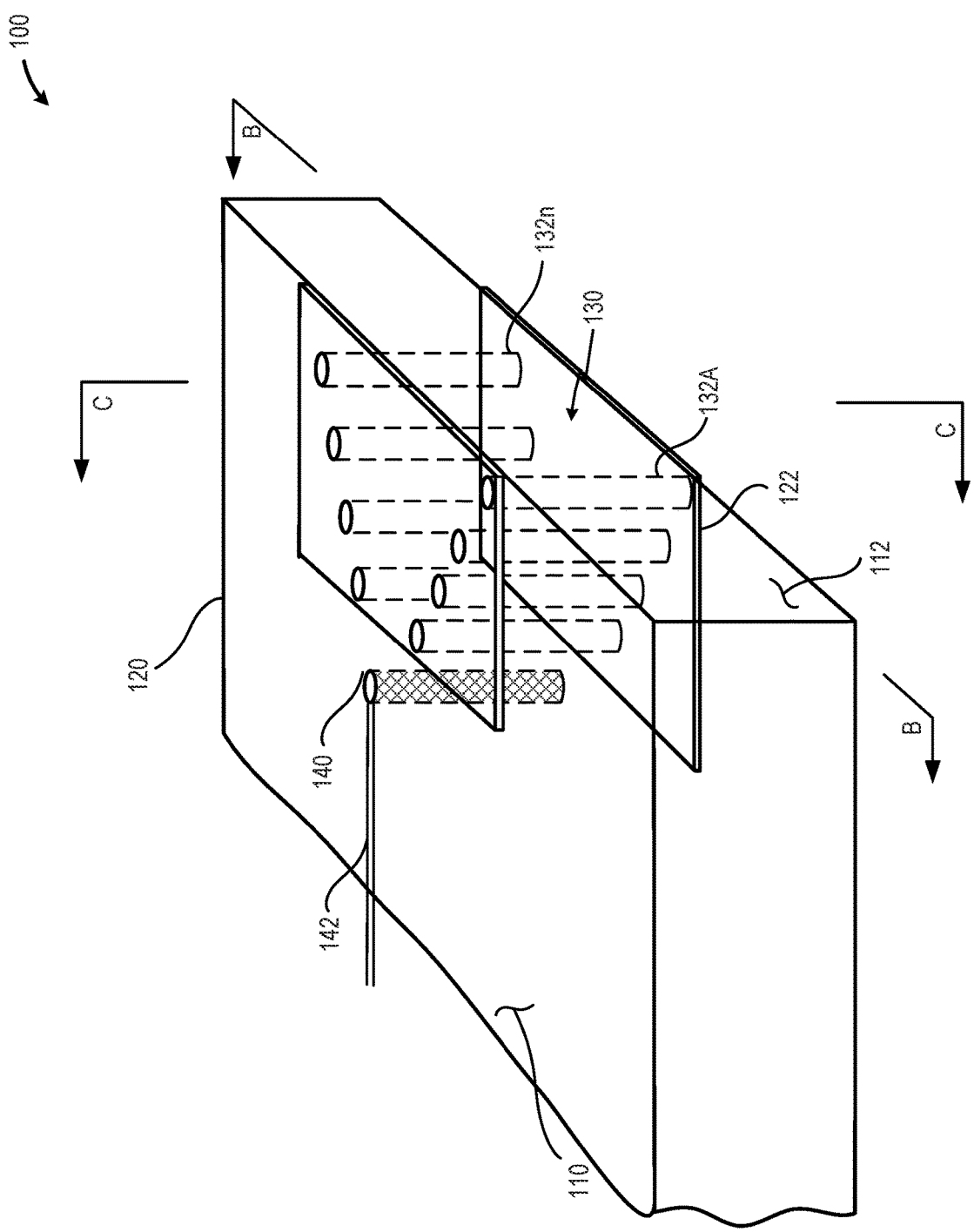
FIG. 1A depicts a perspective view of an illustrative semiconductor package integrated side-radiating waveguide launcher system that includes a dielectric medium disposed between a first conductive member and a second conductive member and at least one conductive structure that conductively couples the first conductive member with the second conductive member, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

As data transfer speeds continue to increase, cost efficient and power competitive solutions are needed for communication between blades installed in a rack and between nearby racks. Such distances typically range from less than 1 meter to about 10 meters or even further. The systems and methods disclosed herein use millimeter-wave transceivers paired with waveguides to communicate data between blades and/or racks at transfer rates in excess of 25 gigabits per second (Gbps). The millimeter wave signal launchers used to transfer data may be formed and/or positioned in, on, or about the semiconductor package. A significant challenge exists in aligning the millimeter-wave signal launcher with the waveguide member to maximize the energy transfer from the millimeter-wave signal launcher to the waveguide member. Further difficulties may arise as a result of the wide variety of available waveguide members. Metallic and metal coated waveguide members are available and may include open or partially open cross-sections such as rectangular, circular, polygonal, oval, and other shapes. Such waveguide members may include hollow members, members having a conductive and/or non-conductive internal structure, and hollow members partially or completely filled with a dielectric medium. Furthermore, space requirements of modern, rack-based, server systems often preclude "high-rise" 90° waveguide transitions from the semiconductor package to a waveguide raceway positioned along the side or rear of the rack-mounted server.

A principal goal in effecting cost-effective and efficient radio frequency (RF) and millimeter wave communication between semiconductor packages is coupling a waveguide to a semiconductor package such that the energy transfer between the emitter and the waveguide member is maximized. Such coupling is complicated by the shape of the waveguide member, the relatively small dimensions associated with the waveguide member (e.g., 5 millimeters or less), the relatively tight tolerances required to maximize energy transfer (e.g., 10 micrometers or less), and a millimeter-wave launcher that is potentially hidden beneath the surface of the semiconductor package. The systems and methods described herein provide new, novel, and innovative systems and methods for forming a side-radiating waveguide launcher on a lateral or side edge surface of a semiconductor package, beneficially improving energy transfer from the emitter to the waveguide and facilitating a low-profile and/or compact installation favored by modern, rack-based, server designs.

In embodiments, one or more side-radiating waveguide launchers may be formed along the side or edge of the semiconductor package rather than on the top or bottom surface of the semiconductor package. Positioning a side-radiating waveguide launcher along the edge of the semiconductor package facilitates a "straight shot" from the semiconductor package to a waveguide regardless of whether a blade server is mounted horizontally or vertically.

The systems and methods disclosed herein are adaptable to a wide variety of operational layouts including individual millimeter-wave antennas, millimeter-wave antennas arranged in regular arrays or patterns, and/or millimeter-wave antennas arranged in irregular arrays or patterns. In some instances, a plurality of waveguide members may be physically coupled or grouped in a pattern or array by a connector member. In such instances, one or more complimentary connector features may be formed and/or deposited along an edge of the semiconductor package such that the connector member properly positions each waveguide member proximate a respective side-radiating waveguide launcher when the connector member engages the complimentary connector feature disposed on the edge of the semiconductor package.

A semiconductor package side-radiating waveguide launcher system is provided. The system may include: a first conductive member disposed proximate an edge of a dielectric medium having a thickness; a second conductive member disposed proximate the edge of the dielectric medium and in transverse opposition across the thickness of the dielectric medium to the first conductive member; at least one conductive structure conductively coupling the first conductive member with the second conductive member, the at least one conductive structure forming a shaped space in the dielectric medium, the shaped space having a first end and an opposed second end; and at least one radio frequency (RF) excitation element disposed at a location within the dielectric medium electrically isolated from the first conductive member, the second conductive member, and the conductive structure.

A plurality of stacked, conductively coupled, semiconductor package side-radiating waveguide launcher systems is provided. Each of the semiconductor package side-radiating waveguide launcher systems may include a first conductive member disposed proximate an edge of a dielectric medium having a thickness; a second conductive member disposed proximate the edge of the dielectric medium and in transverse opposition across the thickness of the dielectric medium to the first conductive member; at least one conductive structure conductively coupling the first conductive member with the second conductive member, the at least one conductive structure forming a shaped space in the dielectric medium, the shaped space having a first end and an opposed second end; and at least one radio frequency (RF) excitation element disposed at a location within the dielectric medium electrically isolated from the first conductive member, the second conductive member, and the conductive structure.

A method of forming a semiconductor package side-radiating waveguide launcher is provided. The method may include: forming a first conductive member proximate an edge of a dielectric medium having a thickness; forming a second conductive member proximate the edge of the dielectric medium and transversely opposed across the thickness of the dielectric medium to the first conductive member; conductively coupling the first conductive member with the second conductive member using at least one conductive structure forming a shaped space in the dielectric medium; the shaped space having a first end and an opposed second end; and disposing at least one radio frequency (RF) excitation element at a location within the dielectric medium electrically isolated from the first conductive member, the second conductive member, and the conductive structure.

A system for forming a semiconductor package side-radiating waveguide launcher is provided. The system may include: a means for forming a first conductive member proximate an edge of a dielectric medium having a thickness; a means for forming a second conductive member proximate the edge of the dielectric medium and transversely opposed across the thickness of the dielectric medium to the first conductive member; a means for conductively coupling the first conductive member with the second conductive member using at least one conductive structure forming a shaped space in the dielectric medium; the shaped space having a first end and an opposed second end; and a means for disposing at least one radio frequency (RF) excitation element at a location within the dielectric medium electrically isolated from the first conductive member, the second conductive member, and the conductive structure.

As used herein the terms "top" and "bottom" and similar terms designate relative and not absolute directions. Thus, a component described as a "top component" of a device and a component described as a "bottom component" of a device may, when the device is inverted, become the "bottom component" and the "top component," respectively.

As used herein the term "modular side radiating waveguide launcher" refers to any launcher device and/or system capable of emitting, propagating, or otherwise communicating an RF signal in a direction that is parallel to the plane of the semiconductor package containing the waveguide launcher. Such modular side radiating waveguide launchers may emit, propagate, or otherwise communicate the RF signal from a side, edge, or similar lateral portion of the semiconductor package containing the waveguide launcher. In some implementations, such modular side radiating waveguide launchers may emit, propagate, or otherwise communicate the RF signal along a plane that is substantially coplanar (i.e., within +/−5°) with the plane of the semiconductor package containing the waveguide launcher. Such modular side radiating waveguide launchers may be at least partially embedded in the semiconductor package. Such modular side radiating waveguide launchers may extend at least partially from a side or lateral surface of the semiconductor package.

Figure 1C:
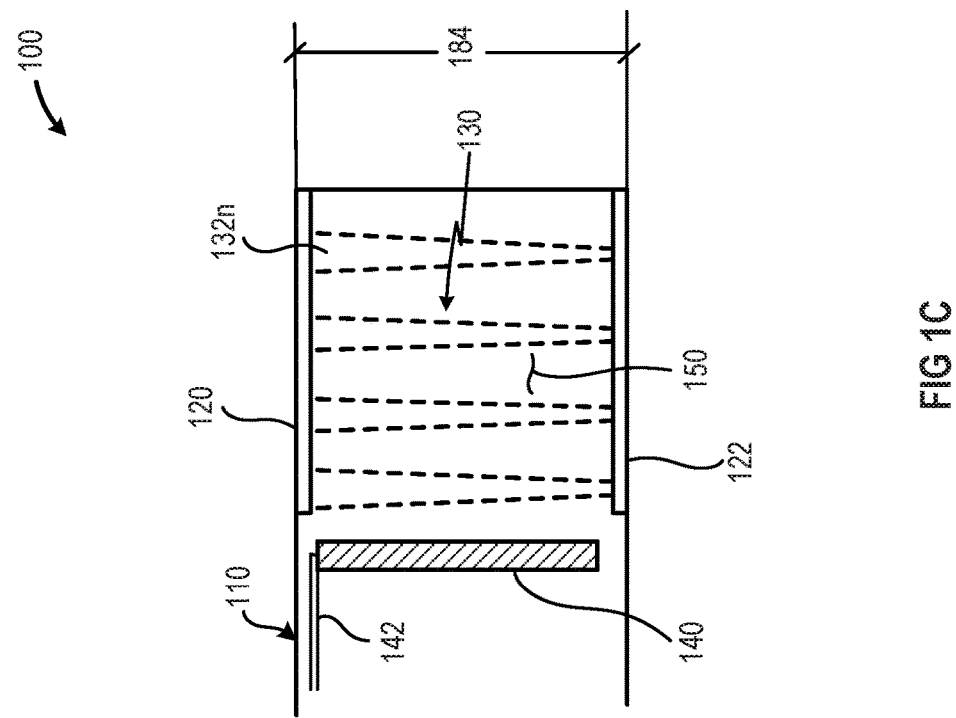
FIG. 1C depicts a cross-sectional elevation view of the illustrative semiconductor package integrated side-radiating waveguide launcher system along sectional line C-C, in accordance with at least one embodiment described herein.
Figure 1B:
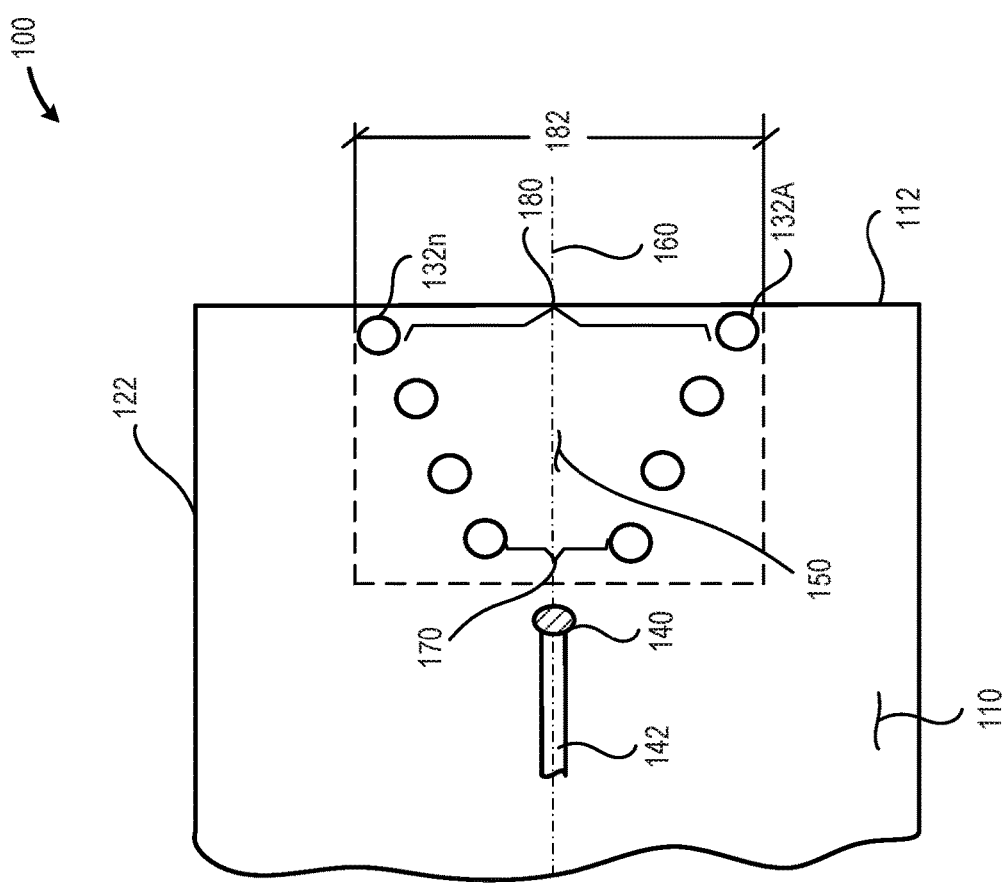
FIG. 1B depicts a cross-sectional plan view of the illustrative semiconductor package integrated side-radiating waveguide launcher system along sectional line B-B, in accordance with at least one embodiment described herein.

FIG. 1A provides a perspective view of an illustrative semiconductor package integrated side-radiating waveguide launcher system 100 that includes a dielectric medium 110 disposed between a first conductive member 120 that forms at least a portion of the "top" of the side-radiating waveguide launcher system 100 and a second conductive member 122 that forms at least a portion of the "bottom" of the side-radiating waveguide launcher system 100 and at least one conductive structure 130 that includes a plurality of conductive members 132A-132n (collectively, "conductive members 132") that conductively couples the first conductive member 120 with the second conductive member 122, in accordance with at least one embodiment described herein. FIG. 1B provides a cross-sectional plan view of the illustrative semiconductor package integrated side-radiating waveguide launcher system 100 along sectional line B-B, in accordance with at least one embodiment described herein. FIG. 1C provides a cross-sectional elevation view of the illustrative semiconductor package integrated side-radiating waveguide launcher system 100 along sectional line C-C, in accordance with at least one embodiment described herein.

In embodiments, the at least one conductive structure 130 may form a shaped space 150 within at least a portion of the dielectric medium 110. In some implementations, the shaped space 150 may be partially or completely filled with dielectric medium 110. In some embodiments, all of a portion of the dielectric medium 110 disposed within shaped space 150 may be removed (e.g., via etching) to form a void space that the shaped space 150 at least partially encompasses. In some embodiments, all of a portion of the dielectric medium 110 disposed within shaped space 150 may be removed (e.g., via etching) to form a void space that may be at least partially refilled with a dielectric medium having a different dielectric constant than the original dielectric medium 110. In embodiments, the shaped space 150 formed by the at least one conductive structure 130 may be symmetric about a longitudinal axis 160 that extends from a first end 170 to a second end 180 of the shaped space 150. The first end 170 of the shaped space 150 may be relatively smaller or narrower than the second end 180 of the shaped space 150. Similarly, the second end 180 of the shaped space 150 may be relatively larger or wider than the first end 170 of the shaped space 150. In some implementations, the shaped space 150 may form a horn-like structure in the dielectric medium 110.

A radio frequency (RF) excitation element 140 may be disposed proximate the first end 170 of the at least one conductive structure 130. In some implementations, the RF excitation element 140 may be at least partially disposed in, on, or about the dielectric medium 110. In some implementations, such as depicted in FIGS. 1A-1C, the RF excitation element 140 may be disposed in the dielectric medium 110 in a location external to the shaped space 150 and electrically isolated from the first conductive member 120, the second conductive member 122, and the conductive structure 130. In other implementations the RF excitation element 140 may be disposed in the dielectric medium 110 at a location internal to the shaped space 150 and electrically isolated from the first conductive member 120, the second conductive member 122, and the conductive structure 130.

The at least one conductive structure 130 may provide a structure that is equivalent to a side-radiating waveguide launcher capable of taking radio frequency (RF) electromagnetic energy from the RF antenna to a waveguide operably coupled directly or indirectly to the at least one conductive structure 130. Similarly, the at least one conductive structure 130 may receive RF electromagnetic energy from an operably coupled waveguide and efficiently transmit the received energy to the RF excitation element 140.

The first conductive member 120 may include any size, shape, or combination of electrically conductive member(s) formed in, on, or about the dielectric medium 110. The first conductive member 120 may, for example, include a patterned metal layer that is photolithographically deposited or printed on the surface of the dielectric medium 110. In some implementations, the first conductive member 120 may be positioned such that dielectric medium 110 is positioned on both sides of the first conductive member 120 rather than just one side as depicted in FIG. 1A. The first conductive member 120 may include one or more electrically conductive materials, such as one or more electrically conductive metals and/or metal alloys. The physical size or dimensions of the first conductive member 120 may be based at least in part on the RF frequency or frequencies transmitted by the semiconductor package integrated side-radiating waveguide launcher system 100. The physical shape of the first conductive member 120 may be based at least in part on the physical configuration of the conductive structure 130 included in the semiconductor package integrated side-radiating waveguide launcher system 100.

The second conductive member 122 may include any size, shape, or combination of electrically conductive member(s) formed in, on, or about the dielectric medium 110. The second conductive member 122 may have the same or a different shape than the first conductive member 120. The second conductive member 122 may be deposited in, on, or about the dielectric medium 110 in which an intervening portion of the dielectric medium 110 is positioned between the first conductive member 120 and the second conductive member 122. In some implementations, all or a portion of the dielectric medium 110 may be interposed between the first conductive member 120 and the second conductive member 122 such that the second conductive member 122 is in transverse opposition across the dielectric medium 110 to the first conductive member 120.

The second conductive member 122 may, for example, include a patterned metal layer that is photolithographically deposited or printed on the surface of the dielectric medium 110. In some implementations, the second conductive member 122 may be positioned such that dielectric medium 110 is positioned on both sides of the second conductive member 122 rather than just one side as depicted in FIG. 1A. The second conductive member 122 may include one or more electrically conductive materials, such as one or more electrically conductive metals and/or metal alloys. The physical size or dimensions of the second conductive member 122 may be based at least in part on the RF frequency or frequencies transmitted by the semiconductor package integrated side-radiating waveguide launcher system 100. The physical shape of the second conductive member 122 may be based at least in part on the physical configuration of the conductive structure 130 included in the semiconductor package integrated side-radiating waveguide launcher system 100.

The conductive structure 130 may include any number, size, type, or combination of electrically conductive members that are physically positioned or arranged to form the shaped space 150. In implementations, the conductive structure 130 may include a plurality of individual conductive structures positioned to form a generally horn-shaped arrangement having a narrow first end 170 and a wider second end 180. In embodiments, the wider second end 180 may be positioned proximate an edge 112 of the dielectric medium 110. In some implementations, the plurality of conductive structures forming the conductive structure 130 may be disposed symmetrically about a longitudinal axis 160 extending from the first end 170 to the second end 180 of the conductive structure 130.

The width 182 and/or height 184 of the second end 180 of the conductive structure 130 may be based, in whole or in part, on the frequency range of the RF excitation element 140 positioned proximate the first end 170 of the conductive structure 130. In some implementations, the width 182 and/or height 184 of the second end 180 of the conductive structure 130 may be approximately equal to one-half of the wavelength of the frequency output of the RF excitation element 140. For example, at an RF launcher operating frequency of 200 GHz, the signal wavelength is approximately 1.5 mm and the second end 180 of the conductive structure 130 may have a width 182 and/or height 184 of about 0.75 mm. The dimensions of the second end 180 of the conductive structure 130 may vary based on the properties (e.g., dielectric constant) of the dielectric material 110 or the replacement dielectric material used to partially or completely fill the shaped space 150 within the conductive structure 130.

In embodiments, each of the conductive member(s) forming the conductive structure 130 may be electrically conductively coupled to the first conductive member 120 and the second conductive member 122. The resulting combination of the conductive structure 130, the first conductive member 120 and the second conductive member 122 forms an electrically conductive, horn-like, structure maintained at a common potential with respect to ground. The spacing between adjacent conductive members 132 may be based, at least in part, on the structural and/or physical properties of the dielectric medium 110 (e.g., conductive members 132 may be positioned to maintain a minimum level of structural strength and/or rigidity in the dielectric medium 110. The spacing between adjacent conductive members 132 may be based, at least in part, on the frequency output of the RF excitation element 140. The spacing between adjacent conductive members 132 may be based, at least in part, on the electrical properties of the dielectric material 110.

In some implementations, such as depicted in FIGS. 1A-1C, the conductive structure 130 may include a plurality of conductive members 132A-132n (collectively "conductive members 132"). Each of the conductive members 132 may include one or more electrically conductive materials, such as one or more electrically conductive metals or metal alloys. In some implementations, at least a portion of the conductive members 132 may include thru-layer vias, such as depicted in FIG. 1C.

The semiconductor package integrated side-radiating waveguide launcher system 100 may include one or more RF excitation elements 140. In at least some implementations, the one or more RF excitation elements 140 may be configured to launch a vertically-propagated signal (e.g., as signal having a propagation plane normal to the first conductive member 120 and/or the second conductive member 122). In some implementations, the one or more RF excitation elements 140 may be configured to launch a horizontally-propagated signal (e.g., a signal having a propagation plane parallel to the first conductive member 120 and/or the second conductive member 122). One or more conductors, traces, or similar conductive elements 142 disposed in whole or in part, in, on, or about the dielectric medium 110 may communicably couple the one or more RF excitation elements 140 to one or more RF sources. The one or more RF excitation elements 140 may be electrically isolated from the first conductive member 120, the second conductive member 122, and the conductive structure 130.

In some implementations, the RF excitation element 140 may include one or more microwave launchers having an output frequency of from about 30 GHz to about 300 GHz and output wavelengths of from about 1 millimeter (mm) to about 1 centimeter (1 cm). In some implementations, the RF excitation element 140 may include one or more microwave launchers having an output frequency in excess of 100 GHz. In some embodiments, the RF excitation element 140 may be communicably coupled to an RF transmitter, an RF receiver, and/or an RF transceiver disposed within the semiconductor package.

The dielectric medium 110 may include any number and/or combination of devices and/or systems at least partially formed using one or more dielectric mediums. In some implementations, the dielectric medium 110 may include a unitary dielectric medium. In other implementations, the dielectric medium 110 may include a plurality of laminated, coupled, or stacked dielectric media, such as a stack of laminated layers. In some implementations, the dielectric medium 110 may form all or a portion of a semiconductor package, for example a semiconductor package that forms at least a portion of a server blade. The dielectric medium 110 may have a thickness slightly greater than the height of the second end 180 of the conductive structure 130. For example, at an RF launcher operating frequency of 200 GHz in a dielectric medium having a dielectric constant of 3, the signal wavelength is approximately 0.87 mm and the second end 180 of the conductive structure 130 may have a width 182 and/or height 184 of about 0.5 mm. The thickness of the dielectric medium in such an instance may be a minimum of about 5 mm.

Figure 2C:
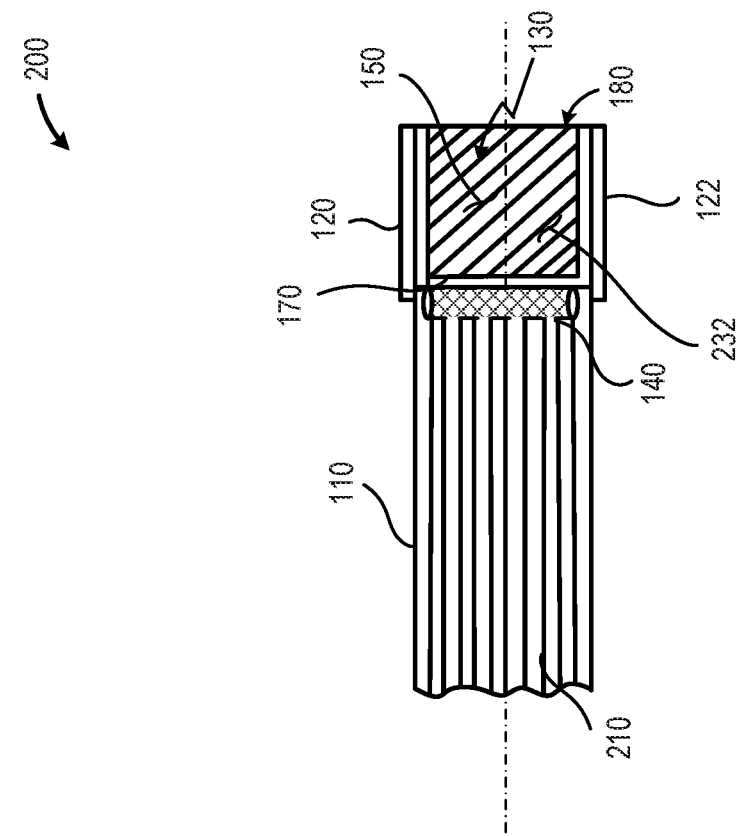
FIG. 2C depicts a cross-sectional elevation view of the illustrative semiconductor package integrated side-radiating waveguide launcher system along sectional line C-C, in accordance with at least one embodiment described herein.
Figure 2B:
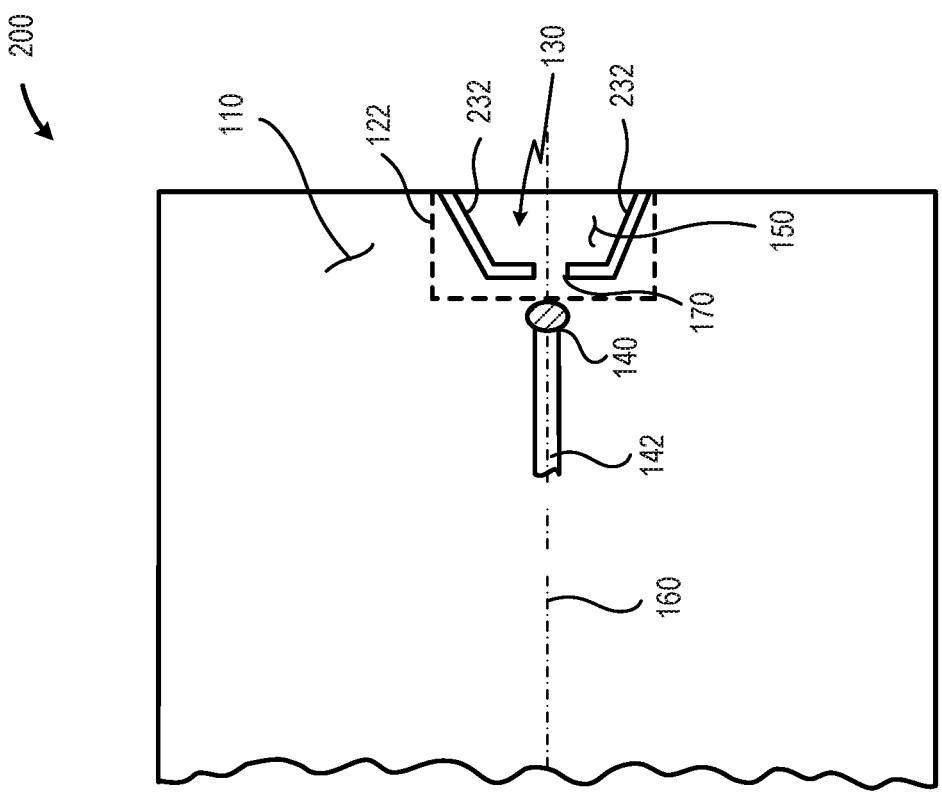
FIG. 2B depicts a cross-sectional plan view of the illustrative semiconductor package integrated side-radiating waveguide launcher system along sectional line B-B, in accordance with at least one embodiment described herein.

FIG. 2A provides a perspective view of an illustrative semiconductor package integrated side-radiating waveguide launcher system 200 that includes a dielectric medium 110 that includes a plurality of dielectric layers 210A-210n (collectively "dielectric layers 210") forming the substrate or semiconductor package disposed between a first conductive member 120 and a second conductive member 122, in accordance with at least one embodiment described herein. Those of skill in the art will realize that additional dielectric or substrate layers may exist above the first conductive member 120 and/or below the second conductive member 122. FIG. 2B provides a cross-sectional plan view of the illustrative semiconductor package integrated side-radiating waveguide launcher system 200 along sectional line B-B, in accordance with at least one embodiment described herein. FIG. 2C provides a cross-sectional elevation view of the illustrative semiconductor package integrated side-radiating waveguide launcher system 200 along sectional line C-C, in accordance with at least one embodiment described herein.

In implementations, the dielectric medium 110 may include a plurality of stacked dielectric layers 210 forming the substrate or semiconductor package. In at least some implementations, the dielectric layers 210 may be laminated or otherwise bonded to each other. In implementations, the first conductive member 120 may be patterned and photolithographically formed on the surface of either an intermediate dielectric layer 210 or a top/bottom dielectric layer 210. In such implementations, the second conductive member 122 may also be patterned and photolithographically formed on the surface of either an intermediate dielectric layer 210 or a top/bottom dielectric layer 210.

As depicted in FIGS. 2A-2C, in some implementations, the edge 112 of the dielectric medium 110 may include a recessed area 220. For example, at least a portion of the dielectric layers 210 forming the dielectric medium 110 may incorporate a recess, notch, detent, or similar void space along at least a portion of an edge of the respective dielectric layer 210. In embodiments, the recessed area along the edge of the dielectric layers 210 may align to form an at least partially open shaped space 150 along the edge 112 of the dielectric medium 110. In embodiments, at least a portion of the recessed area 220 may be edge plated. In such embodiments, the at least one conductive structure 130 may include an edge-plated portion of the dielectric medium. In some implementations, the edge-plated portion of the dielectric medium 110 may provide a horn-shaped space 150 that accommodates the operable coupling of a waveguide such that the transfer of electromagnetic energy emitted by the RF excitation element 140 to the waveguide is maximized.

In some implementations, all or a portion of the RF excitation element 140 may be disposed or otherwise positioned in the shaped space 150 formed by the at least one conductive structure 130. In other implementations, all or a portion of the RF excitation element 140 may be disposed or otherwise positioned external to the shaped space 150 formed by the at least one conductive structure 130.

Although the conductive structure 130 is depicted as an edge plated side-radiating waveguide launcher 232 in FIGS. 2A-2C, those of skill in the art will appreciate such an edge plated side-radiating waveguide launcher 232 as described above may be used with equal effectiveness on the monolithic or homogeneous dielectric medium 110 depicted in FIGS. 1A-1C. Similarly, although the conductive structure 130 is depicted as a plurality of conductive structures 132 arranged in a pattern forming a side-radiating waveguide launcher in FIGS. 1A-1C, those of skill in the art will appreciate the plurality of conductive structures 132 as described above may be used with equal effectiveness in a dielectric medium 110 that includes a plurality of layered dielectric layers 210 such as depicted in FIGS. 2A-2C.

Figure 3B:
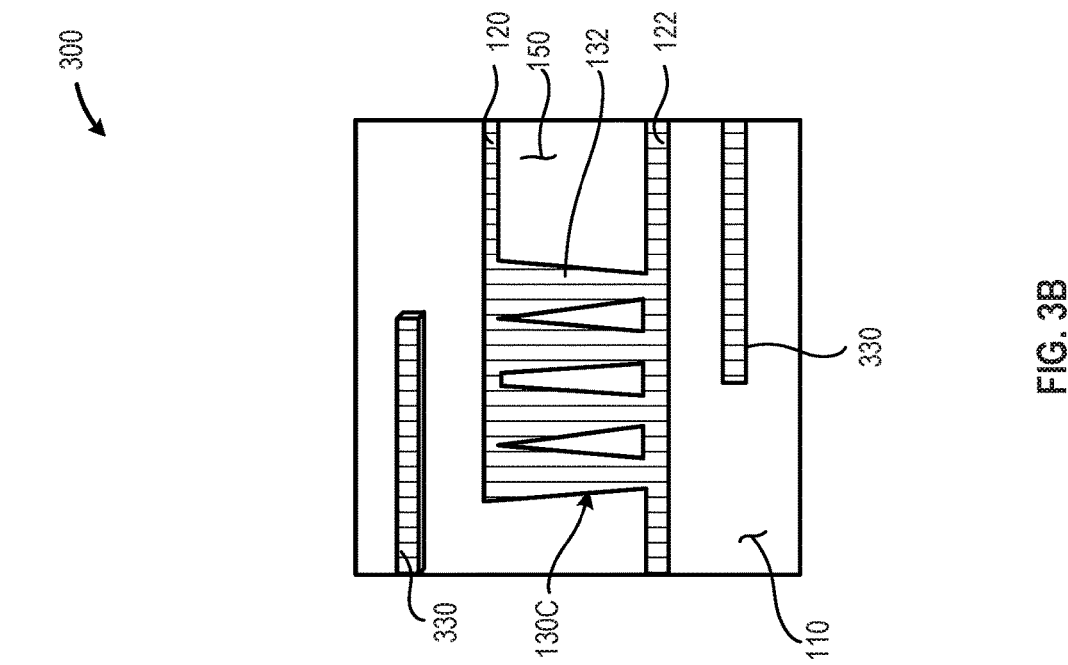
FIG. 3B depicts a cross sectional elevation view of the illustrative semiconductor package integrated side-radiating waveguide launcher system depicted in FIG. 3A, in accordance with at least one embodiment described herein.
Figure 3A:
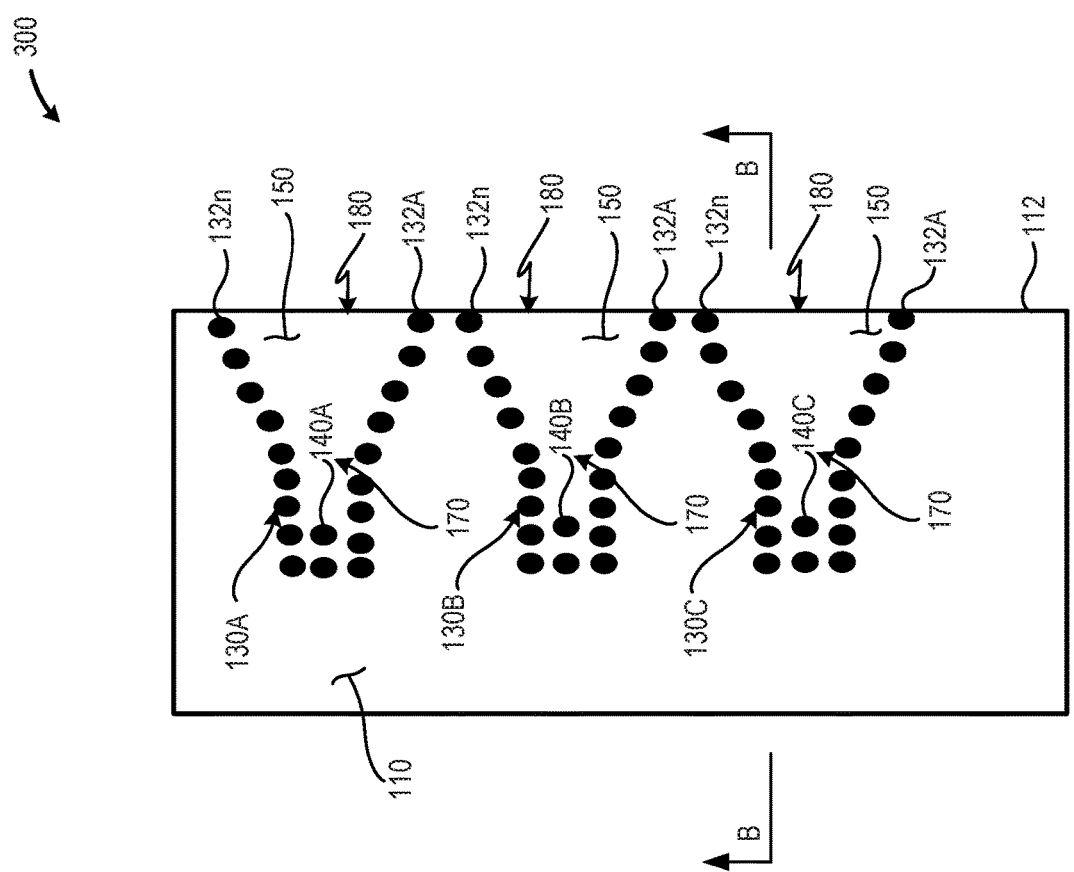
FIG. 3A depicts a cross-sectional plan view of an illustrative semiconductor package integrated side-radiating waveguide launcher system that includes three conductive structures and three RF launchers disposed in a dielectric medium, in accordance with at least one embodiment described herein.

FIG. 3A provides a cross-sectional plan view of an illustrative semiconductor package integrated side-radiating waveguide launcher system 300 that includes three conductive structures 130A-130C and three RF launchers 140A-140C disposed in a dielectric medium 110, in accordance with at least one embodiment described herein. FIG. 3B provides a cross sectional elevation view of the illustrative semiconductor package integrated side-radiating waveguide launcher system 300 depicted in FIG. 3A, in accordance with at least one embodiment described herein. As depicted in FIG. 3A, multiple conductive structures 130 may be disposed proximate an edge 112 of the dielectric medium 110.

As depicted in FIG. 3B, the first conductive member 120 and the second conductive member 122 may be patterned and formed in the dielectric medium 110. In such implementations, the dielectric medium 110 may include other conductive elements 330 disposed within the dielectric medium 110, such conductive elements 330 may include but are not limited to, one or more electronic components, one or more semiconductor devices, and/or similar structures that may or may not be associated with the RF excitation element 140. The conductive members 132 may include thru-layer vias that conductively couple the first conductive member 120 to the second conductive member 122.

Figure 4:
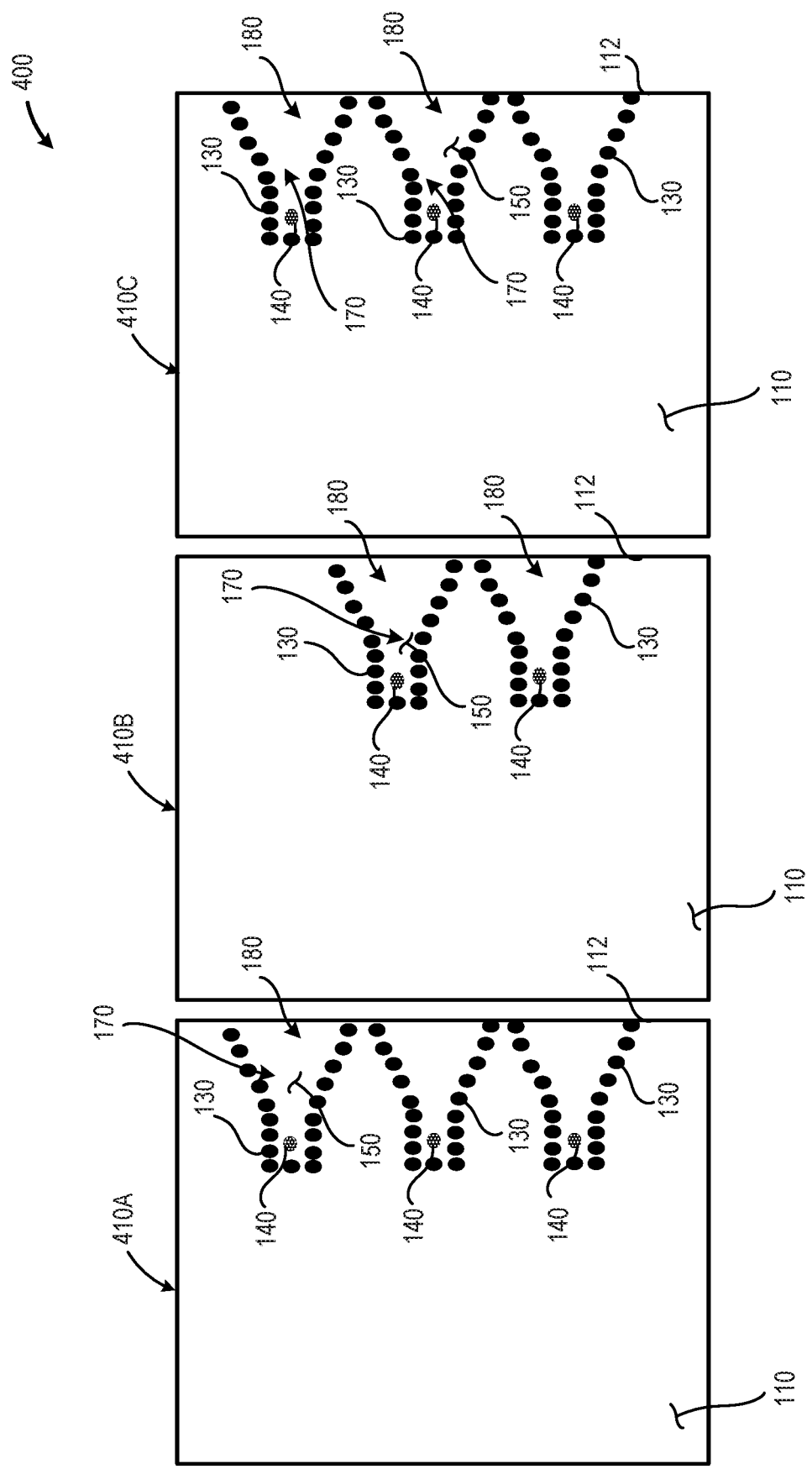
FIG. 4 depicts a cross-sectional plan view of an illustrative semiconductor package integrated side-radiating waveguide launcher system that includes multiple layers, each having a plurality of conductive structures, in accordance with at least one embodiment described herein.

FIG. 4 provides a cross-sectional plan view of an illustrative semiconductor package integrated side-radiating waveguide launcher system 400 that includes multiple layers 410A-410C, each having a plurality of conductive structures 130, in accordance with at least one embodiment described herein. In some implementations, a semiconductor package may include multiple, stacked, dielectric media 110A-110n, each including a plurality of conductive structures 130. As depicted in FIG. 4, each of the layers 410 may include a plurality of conductive structures 130 that are offset from each preceding layer 410. In some instances, such offset conductive structures also results in the RF launchers 140 being offset in alternating layers 410. Offsetting the RF launchers 140 on alternating layers 410 within the dielectric medium 110 beneficially permits the routing of conductors feeding the RF launchers 140 through the various layers. For example, as depicted in FIG. 4, the feed to the RF excitation element 140 located in the second layer 410B may be routing between the conductive structures 130 in the layer above (layer 410C) and/or the layer below (layer 410A).

Figure 5:
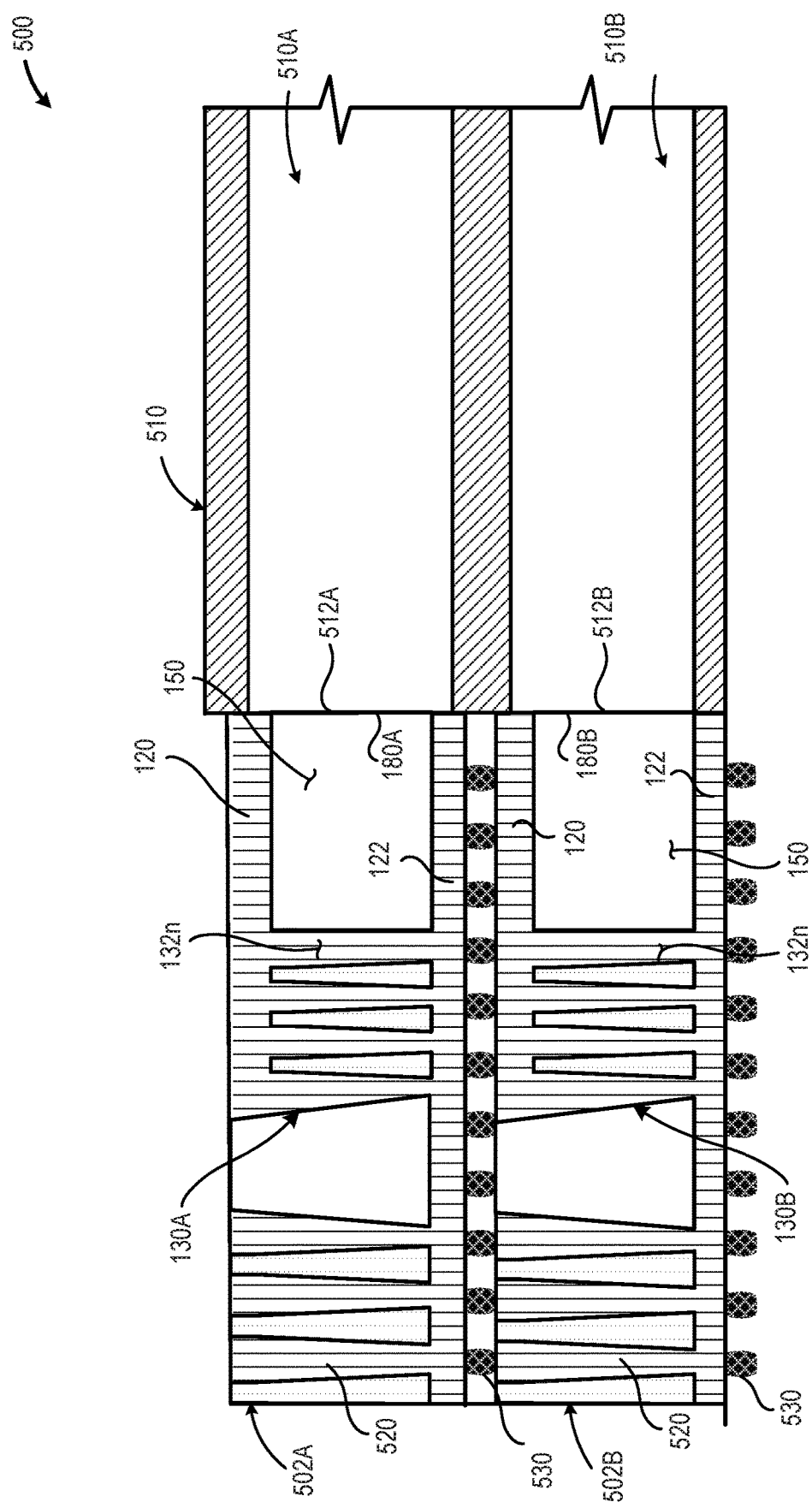
FIG. 5 depicts a cross-sectional elevation view of an illustrative semiconductor package integrated side-radiating waveguide launcher system that includes stacked ball-grid array (BGA) semiconductor packages operably coupled to waveguides, respectively, in accordance with at least one embodiment described herein.

FIG. 5 provides a cross-sectional elevation view of an illustrative semiconductor package integrated side-radiating waveguide launcher system 500 that includes stacked ball-grid array (BGA) semiconductor packages 502A and 502B (collectively, "semiconductor packages 502") operably coupled to waveguides 510A and 510B (collectively, "waveguides 510"), respectively, in accordance with at least one embodiment described herein. As depicted in FIG. 5, each of the semiconductor packages 502 may include a ball-grid array 530 to facilitate the communicable coupling of the semiconductor packages 502. Also as depicted in FIG. 5, each of the semiconductor packages 502 may include a number of vias 520 used to communicably couple the semiconductor packages 502.

The waveguides 510 may include any type, number, and/or combination of structures capable of conducting RF electromagnetic energy generated by the RF excitation element 140 and transmitted to the waveguide 510 via the conductive structure 130. Example waveguides 510 include hollow conductive waveguides, waveguides having an internal structure, and waveguides partially or completely filled with a dielectric medium. A first end 512A and 512B of each waveguide 510A and 510B, respectively, may be disposed proximate the second end 180A and 180B of a respective conductive structure 130A and 130B. In embodiments, the waveguides 510 may be operably coupled to the conductive structure 130 via slideable insertion of the waveguide 510 into a respective conductive structure. In other embodiments, the waveguides 510 may be operably coupled to the conductive structure using a connector or similar attachment feature (not visible in FIG. 5) disposed in, on, or about at least a portion of the exterior surface of the edge 112 of the semiconductor package 502. Such connectors or attachment features may permit an electrically conductive pressure or friction fit of the waveguide in location with respect to the conductive structure 130 such that the electromagnetic energy transfer from the conductive structure 130 to the waveguide 510 is maximized. In yet other embodiments, a connector housing that includes one or more connection fixtures, features, or devices may be disposed about the first end 512 of the waveguides and a corresponding or complimentary connection fixture, feature, or device may be disposed on the edge 112 of the semiconductor package 502.

In operation, the conductive structure 130, first conductive member 120 and second conductive member 122 receive the electromagnetic energy emitted by the RF excitation element 140. The electromagnetic energy is transmitted to the second end 180 of the conductive structure 130 where at least a portion of the energy is transferred to the waveguide 510. The waveguide 510 then propagates the electromagnetic energy to a destination point either in the same rack or in a nearby rack.

Figure 6:
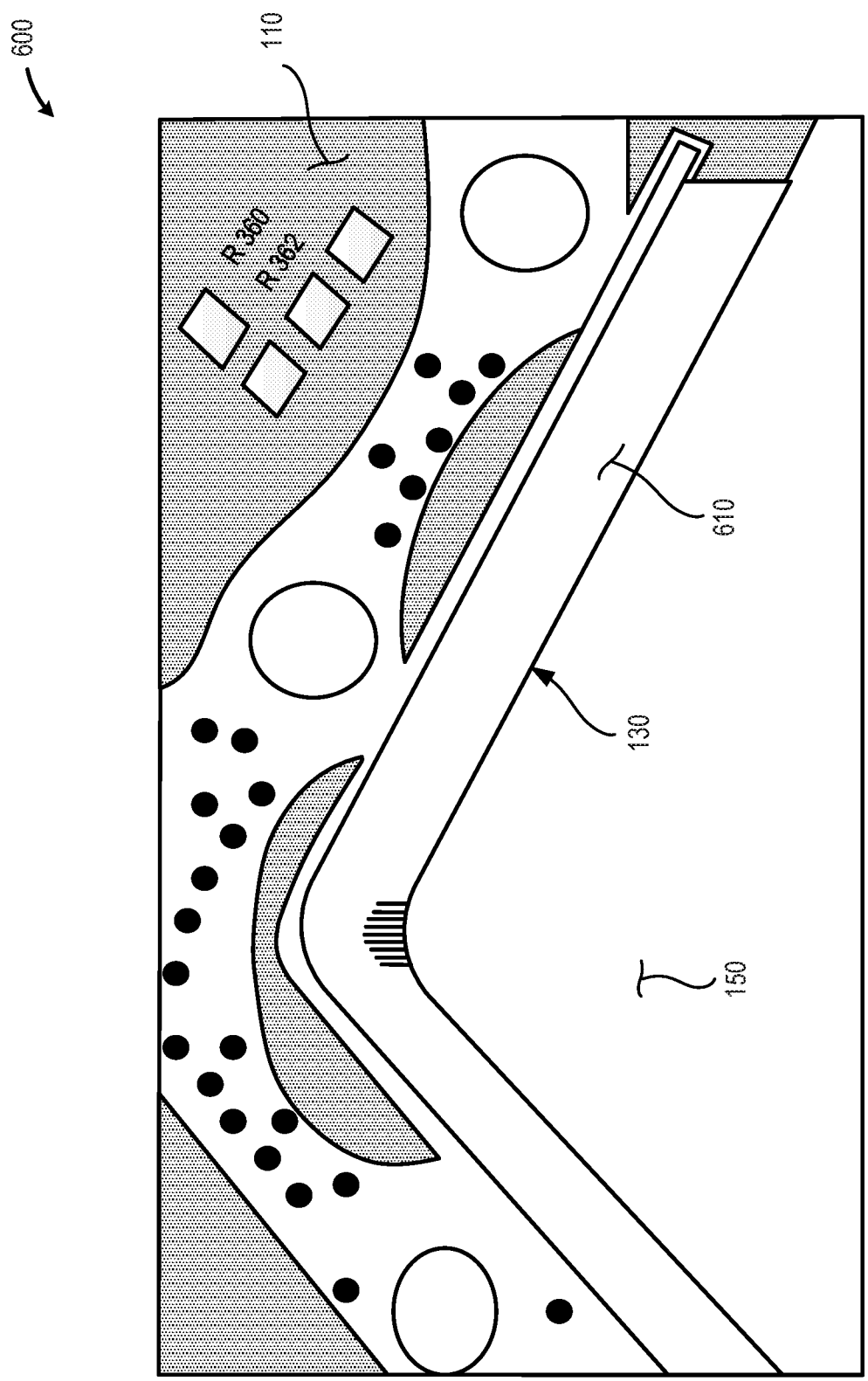
FIG. 6 depicts a perspective view of an illustrative semiconductor package integrated side-radiating waveguide launcher system that includes a dielectric medium featuring edge plating that provides the conductive structure, in accordance with at least one embodiment described herein.

FIG. 6 provides a perspective view of an illustrative semiconductor package integrated side-radiating waveguide launcher system 600 that includes a dielectric medium 110 featuring edge plating 610 that provides the conductive structure 130 (depicted in FIG. 6 with the first conductive member 120 and the second conductive member 122 removed to more clearly depict the edge plating), in accordance with at least one embodiment described herein. In embodiments, a portion of an edge 112 of the dielectric medium 110 may be recessed and a portion of the recessed edge 112 may be edge plated 610 to provide at least a portion of the conductive structure 130. While edge plating 610 is shown as a continuous section (i.e., an "L" shaped member in FIG. 6), it may be appreciated that the edge plating may have one or more gaps, openings, or discontinuities (e.g., at the vertex) to accommodate the excitation element 140. The edge plating 610 may conductively couple to a waveguide 510 such that, in operation, the edge plating 610 transmits the RF electromagnetic energy emitted by the RF excitation element 140 to the waveguide 510. In embodiments, the edge plating 610 may extend across the full thickness of the edge 112 of the dielectric medium 110. In other embodiments, the edge plating 610 may extend across only a portion of the thickness of the dielectric medium 110.

Figure 7:
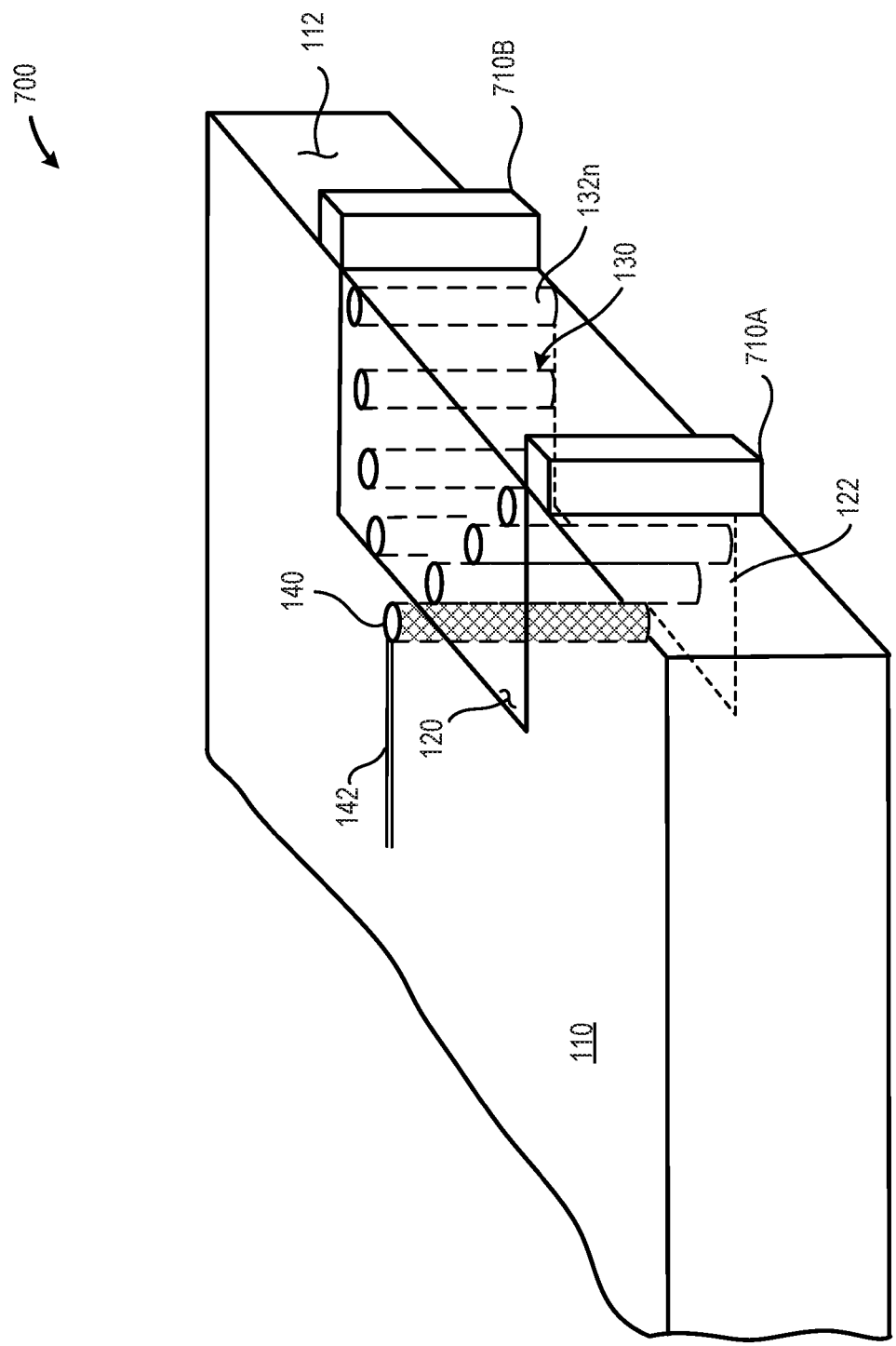
FIG. 7 depicts a perspective view of an illustrative semiconductor package integrated side-radiating waveguide launcher system that includes a number of connection features that facilitate the operable and conductive coupling of a waveguide to the conductive structure, in accordance with at least one embodiment described herein.

FIG. 7 provides a perspective view of an illustrative semiconductor package integrated side-radiating waveguide launcher system 700 that includes a number of connection features 710A and 710B (collectively "connection features 710") that facilitate the operable and conductive coupling of a waveguide 510 to the conductive structure 130, in accordance with at least one embodiment described herein. In embodiments, one or more connection features 710 may be disposed at least partially across all or a portion of the edge 112 of the dielectric medium 110. In some implementations, some or all of the connection features 710 may extend fully or partially from the edge 112 of the dielectric medium 110. In some implementations, some or all of the connection features 710 may be at least partially recessed into the edge 112 of the dielectric medium 110.

The one or more connection features 710 may include one or more conductive materials, may contain one or more conductive elements, and/or may include one or more conductive connectors to facilitate the conductive coupling of a waveguide 510 to the conductive structure 130 when the waveguide 510 engages or otherwise couples to the connection features 710. In embodiments, the waveguide 510 may engage the one or more connection features 710 using a press- or friction-fit in which friction retains a waveguide 510 after being slideably inserted into and engaging the one or more connection features 710. In embodiments, the waveguide 510 may include a connector housing that includes one or more connection fixtures, features, or devices may be disposed about the first end 512 of the waveguide 510. In such embodiments, the one or more connection features 710 may include one or more complimentary or corresponding connection fixtures, features, or devices such that when the waveguide 510 is slideably inserted into the one or more connection features 710, the connection fixtures, features, or devices (clips, snaps, threaded fasteners, spring clips, etc.) retain the waveguide 510 proximate the second end 180 of the conductive structure 130.

Figure 8:
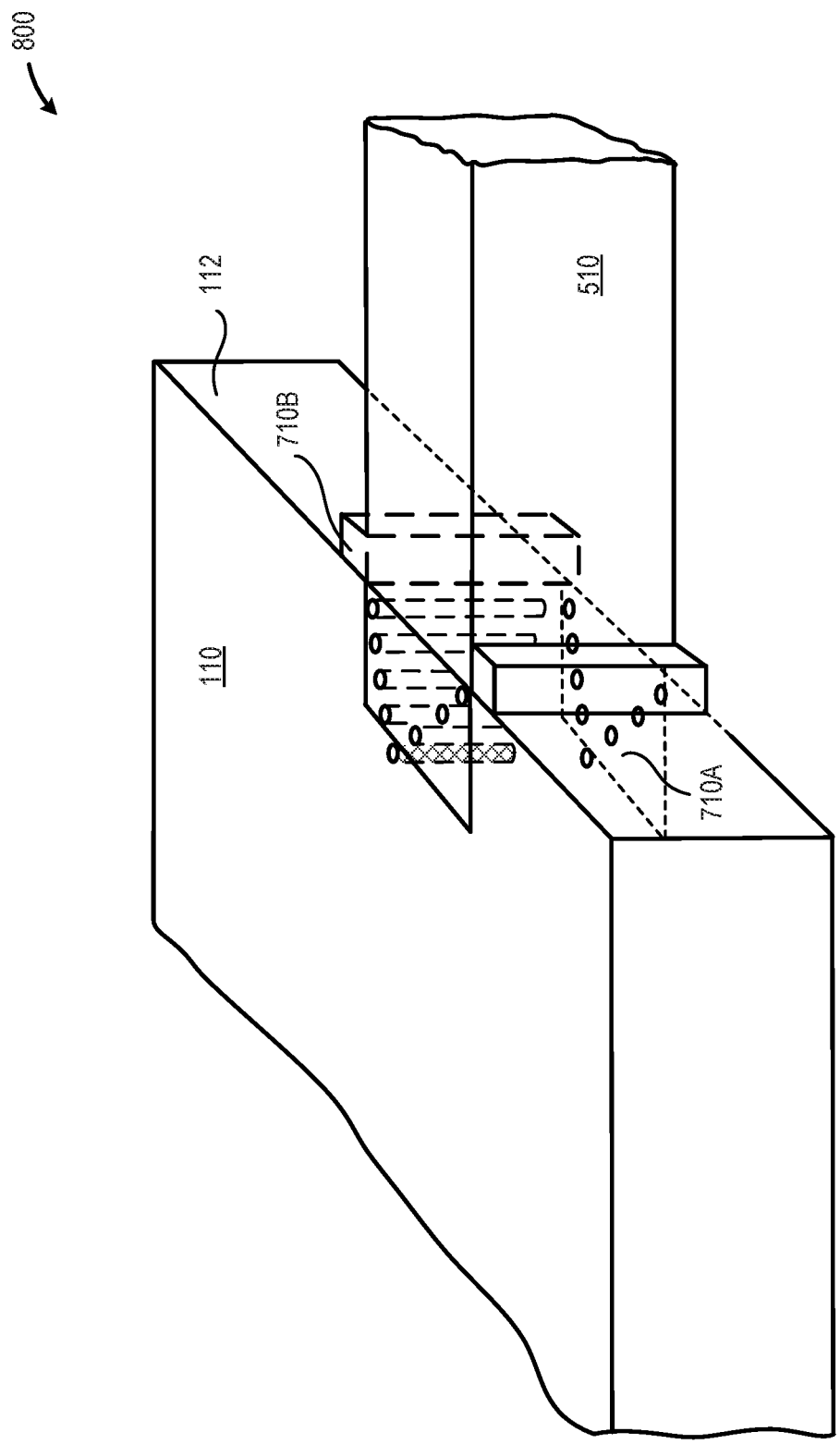
FIG. 8 depicts a perspective view of an illustrative semiconductor package integrated side-radiating waveguide launcher system that includes a waveguide operably coupled to a semiconductor package by a number of connection features, in accordance with at least one embodiment described herein.

FIG. 8 provides a perspective view of an illustrative semiconductor package integrated side-radiating waveguide launcher system 800 that includes a waveguide 510 operably coupled to a semiconductor package 502 by a number of connection features 710A and 710B, in accordance with at least one embodiment described herein. In embodiments, the waveguide 510 may engage the connection features 710 in a manner that positions the waveguide proximate the second end 180 of the conductive structure 130. In embodiments, the connection features 710 may position the waveguide 510 in a location proximate the second end 180 of the conductive structure 130 such that energy transfer from the conductive structure 130 to the waveguide is maximized.

Figure 9:
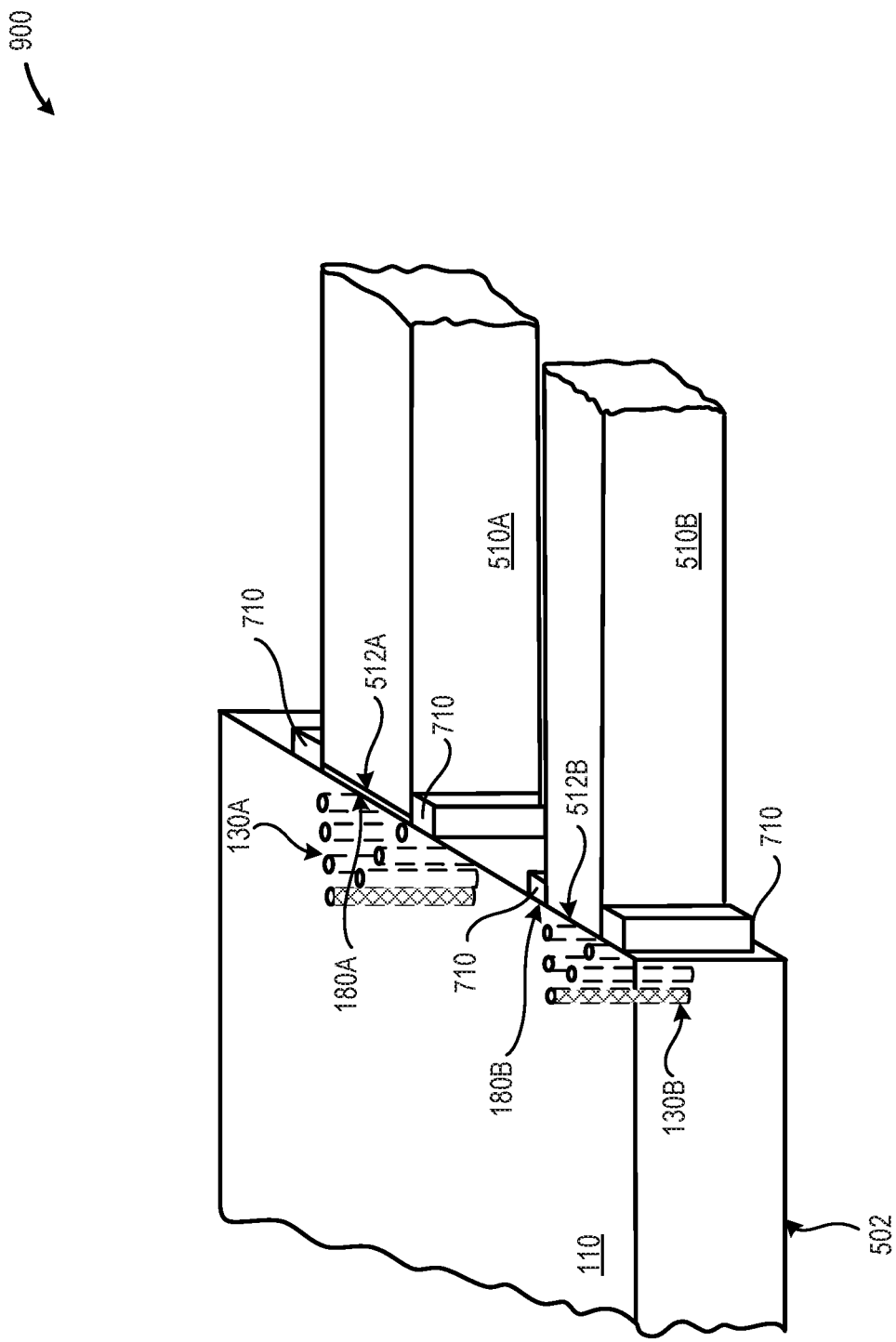
FIG. 9 depicts a perspective view of an illustrative semiconductor package integrated side-radiating waveguide launcher system that includes two waveguides operably coupled to a single semiconductor package that includes two conductive structures in accordance with at least one embodiment described herein.

FIG. 9 provides a perspective view of an illustrative semiconductor package integrated side-radiating waveguide launcher system 900 that includes two waveguides 510A and 510B operably coupled to a single semiconductor package 502 that includes two conductive structures 130A and 130B, in accordance with at least one embodiment described herein. In some implementations, a semiconductor package may include any number of conductive structures 130. An RF excitation element 140A and excitation element 140B may be disposed proximate the first end 130A, 130B of each of the conductive structures 130. The RF launchers 140 may operate at the same or different frequencies. For example, the RF launchers 140 may both transmit RF signals in the microwave electromagnetic spectrum of 30 GHz to 300 GHz. As depicted in FIG. 9, the first end 512 of each waveguide 510 is disposed proximate the second end 180 of a respective conductive structure 130 to maximize the electromagnetic energy transfer from the conductive structure 130 to the waveguide 510. In embodiments, the connection features 710 retain the first end 512 of the waveguide 510 at a physical location that maximizes the electromagnetic energy transfer from the conductive structure 130 to the waveguide 510.

Figure 10:
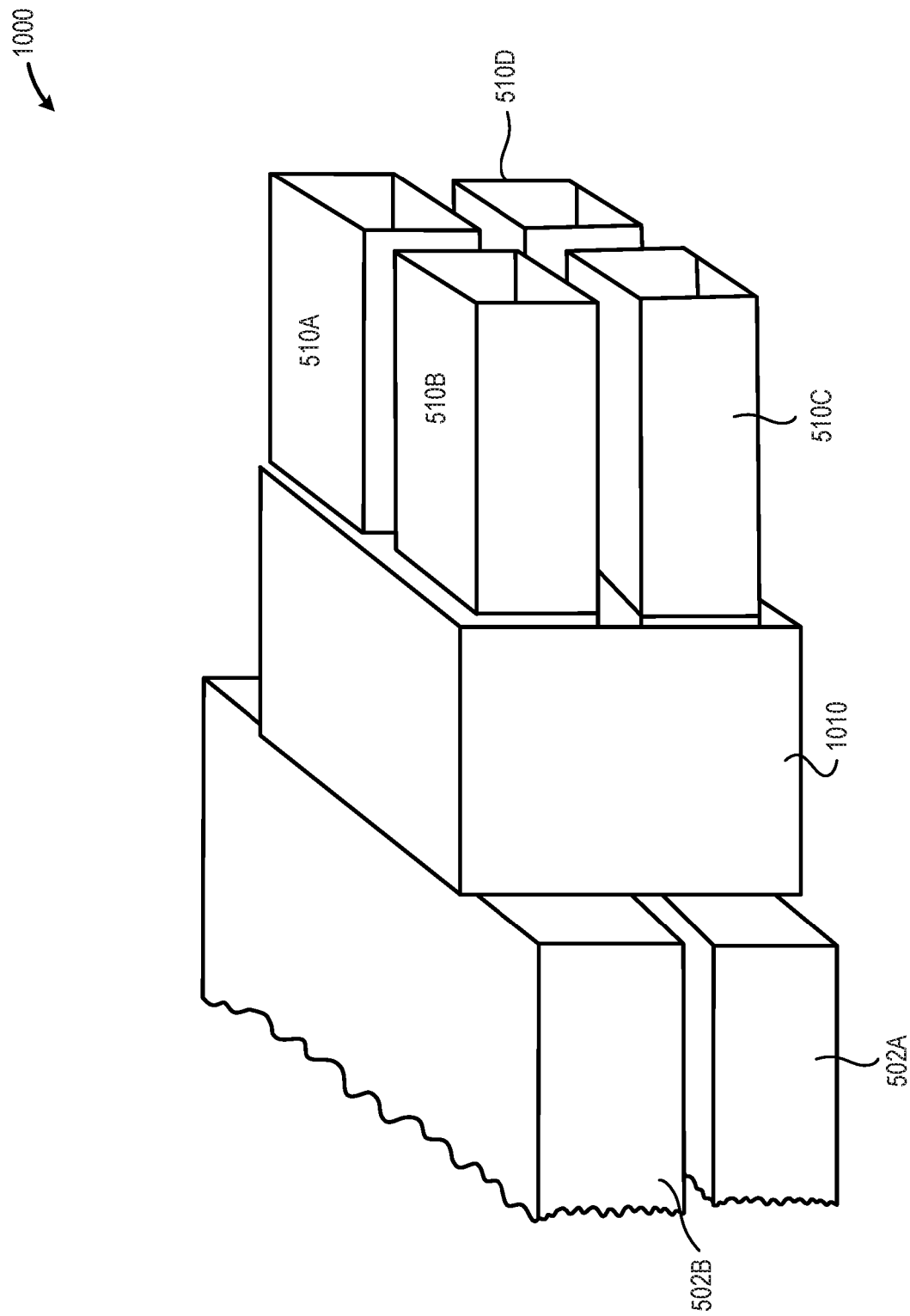
FIG. 10 depicts a perspective view of an illustrative semiconductor package integrated side-radiating waveguide launcher system that includes four waveguides surrounded by an end connector which couples two waveguides to a first semiconductor package and which couples two waveguides to a second semiconductor package, in accordance with at least one embodiment described herein.

FIG. 10 provides a perspective view of an illustrative semiconductor package integrated side-radiating waveguide launcher system 1000 that includes four waveguides 510A-510D surrounded by an end connector 1010 which couples two waveguides 510A and 510B to a first semiconductor package 502A and which couples two waveguides 510C and 510D to a second semiconductor package 502B, in accordance with at least one embodiment described herein. As depicted in FIG. 10, the first semiconductor packages 510A and the second semiconductor packages 510B may be stacked such as described above with regard to FIG. 5. The end connector 1010 maintains the position of the waveguides 510 with respect to each other such that when one of the waveguides 510 is aligned with the second end 180 of a conductive structure 130, the remaining waveguides 510 are similarly aligned.

In some implementations, the end connector 1010 may include one or more connection features that engage one or more complimentary or corresponding connection features disposed on an external surface of the semiconductor packages 502. In some implementations, the one or more connection features may permit the detachable attachment of the end connector 1010 to the semiconductor packages 502. In some implementations, the one or more connection features may permanently affix the end connector 1010 to the semiconductor packages 502.

Figure 11:
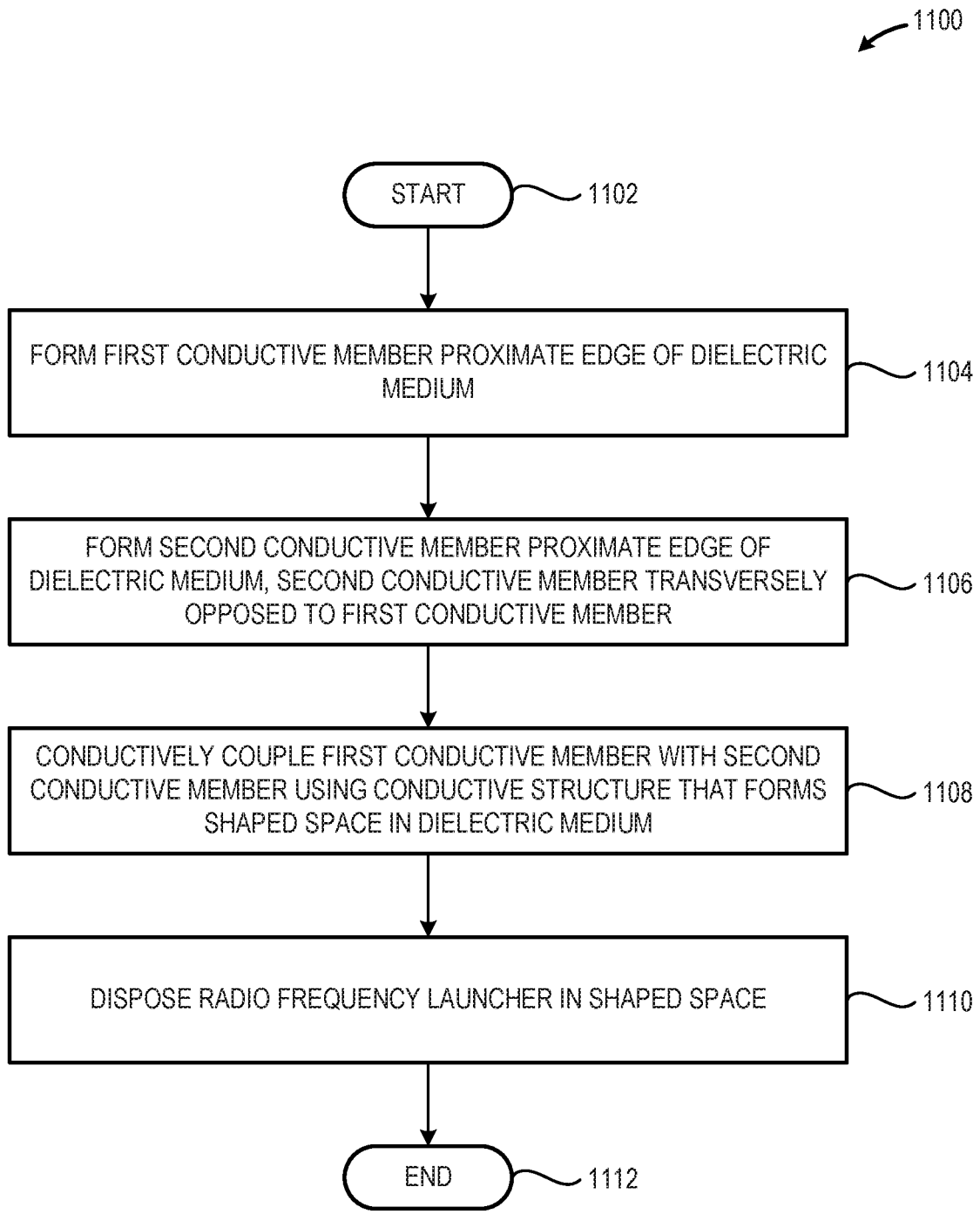
FIG. 11 depicts a high-level logic flow diagram of an illustrative method of forming a semiconductor package integrated side-radiating waveguide launcher, in accordance with at least one embodiment described herein.

FIG. 11 depicts a high-level logic flow diagram of an illustrative method 1100 of forming a semiconductor package integrated side-radiating waveguide launcher 100, in accordance with at least one embodiment described herein. A semiconductor package integrated side-radiating waveguide launcher 100 permits the operable coupling of a waveguide 510 to the semiconductor package 502 without the need for intervening adapters, connectors, or similar devices. The ability to directly couple a waveguide to the semiconductor package 502 improves the efficiency and signal to noise ratio of the system by maximizing the electromagnetic energy transferred from the conductive structure 130 to the waveguide 510. The method 1100 commences at 1102.

At 1104, a first conductive member 120 is formed proximate an edge 112 of a dielectric medium 110. In some implementations, the first conductive member 120 may be patterned, for example using one or more photolithographic processes, on an intermediate or exterior surface of the dielectric medium 110. The first conductive member 120 may form at least a portion of the semiconductor package integrated side-radiating waveguide launcher 100. In some implementations, the first conductive member 120 may form a portion of the boundary defining the shaped space 150.

At 1106, a second conductive member 122 may be formed proximate the edge 112 of the dielectric medium 110. The second conductive member 122 may be positioned in transverse opposition across the thickness of the dielectric medium 110 to the first conductive member 120. In some implementations, the second conductive member 122 may be patterned, for example using one or more photolithographic processes, on an intermediate or exterior surface of the dielectric medium 110. The second conductive member 122 may form at least a portion of the semiconductor package integrated side-radiating waveguide launcher 100. In some implementations, the second conductive member 122 may form a portion of the boundary defining the shaped space 150.

At 1108, a conductive structure 130 may be formed in the dielectric material 110. In embodiments, the conductive structure 130 may include a plurality of conductive members 132. In other embodiments, the conductive structure 130 may include an edge plated structure disposed along a recessed portion of the edge 112 of the dielectric medium 110. The conductive structure 130 may include a first, narrow, end 170 and a second, wide, end 180. The conductive structure 130 may be bilaterally symmetric about a longitudinal axis 160 that extends from the first end 170 to the second end 180 of the conductive structure 130. In some implementations, the plurality of conductive members 132 may include a plurality of thru-layer vias extending at least partially through the dielectric medium 110.

The conductive structure 130 may be conductively coupled to the first conductive member 120 and to the second conductive member 122. As such, the conductive structure 130, the first conductive member 120, and the second conductive member 122 form a boundary defining the shaped space 150.

At 1110, a radio frequency (RF) excitation element 140 may be disposed proximate the first end 170 of the conductive structure 130. In some implementations, the RF excitation element 140 may include a microwave launcher capable of transmitting and/or receiving RF signals having a frequency of from about 30 GHz to about 300 GHz.

Additionally, operations for the embodiments have been further described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. The embodiments are not limited to this context.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

According to example 1, there is provided a semiconductor package side-radiating waveguide launcher system. The system may include: a first conductive member disposed proximate an edge of a dielectric medium having a thickness; a second conductive member disposed proximate the edge of the dielectric medium and in transverse opposition across the thickness of the dielectric medium to the first conductive member; at least one conductive structure conductively coupling the first conductive member with the second conductive member, the at least one conductive structure forming a shaped space in the dielectric medium, the shaped space having a first end and an opposed second end; and at least one radio frequency (RF) excitation element disposed at a location within the dielectric medium electrically isolated from the first conductive member, the second conductive member, and the conductive structure.

Example 2 may include elements of example 1 where the shaped space may include a shaped space bilaterally symmetric about a longitudinal axis extending from the first end of the space to the second end of the space.

Example 3 may include elements of example 2 where the at least one conductive structure may form a shaped space in the dielectric medium having a relatively narrow first end and a relatively wide second end.

Example 4 may include elements of example 1 where the RF excitation element may be disposed within the dielectric medium at a location internal to the shaped space formed by the conductive structure.

Example 5 may include elements of example 1 where the RF excitation element may be disposed within the dielectric medium at a location external to the shaped space formed by the conductive structure.

Example 6 may include elements of example 3 where the at least one conductive structure may include a plurality of conductive members arranged in a pattern to form the shaped space, wherein at least portion of the plurality of conductive members extend transversely through the dielectric medium.

Example 7 may include elements of example 6 where the plurality of conductive members may include a plurality of thru-layer vias.

Example 8 may include elements of example 2 where the dielectric medium may include a plurality of dielectric layers.

Example 9 may include elements of example 8 where at least a portion of the plurality of dielectric layers may include an edge, at least a portion of which is recessed into the respective dielectric layer; and where the at least one conductive structure may include an edge plating disposed on at least a portion of the recessed edge included on the portion of the plurality of dielectric layers.

Example 10 may include elements of any of examples 3 through 9, and may additionally include a waveguide mounting structure to accept an attachment of a waveguide member proximate the second end of the conductive structure.

Example 11 may include elements of example 10 where the waveguide mounting structure may include a waveguide mounting structure disposed at least partially on the edge of the dielectric medium.

According to example 12, there is provided a plurality of stacked, conductively coupled, semiconductor package side-radiating waveguide launcher systems, each of the semiconductor package side-radiating waveguide launcher systems. The system may include a first conductive member disposed proximate an edge of a dielectric medium having a thickness; a second conductive member disposed proximate the edge of the dielectric medium and in transverse opposition across the thickness of the dielectric medium to the first conductive member; at least one conductive structure conductively coupling the first conductive member with the second conductive member, the at least one conductive structure forming a shaped space in the dielectric medium, the shaped space having a first end and an opposed second end; and at least one radio frequency (RF) excitation element disposed at a location within the dielectric medium electrically isolated from the first conductive member, the second conductive member, and the conductive structure.

Example 13 may include elements of example 12 where the shaped space may include a shaped space bilaterally symmetric about a longitudinal axis extending from the first end of the space to the second end of the space.

Example 14 may include elements of example 13 where the at least one conductive structure may form a shaped space in the dielectric medium having a relatively narrow first end and a relatively wide second end.

Example 15 may include elements of example 12 where the RF excitation element may be disposed within the dielectric medium at a location internal to the shaped space formed by the conductive structure.

Example 16 may include elements of example 12 where the RF excitation element may be disposed within the dielectric medium at a location external to the shaped space formed by the conductive structure.

Example 17 may include elements of example 12, and may additionally include a waveguide mounting structure to accept an attachment of a waveguide bundle that may include a plurality of waveguide members, each of the plurality of waveguide members corresponding to a respective one of the plurality of semiconductor package side-radiating waveguide launcher systems.

Example 18 may include elements of example 12 where the at least one conductive structure in each of the plurality of semiconductor package side-radiating waveguide launcher systems may include: a plurality of conductive members arranged in a pattern to form the shaped space, wherein at least portion of the plurality of conductive members extend transversely through the dielectric medium.

Example 19 may include elements of example 12 where the dielectric medium in each of the plurality of semiconductor package side-radiating launchers may include a plurality of dielectric layers.

Example 20 may include elements of example 19 where at least a portion of the plurality of dielectric layers in each of at least a portion of the plurality of semiconductor package horn antennas includes an edge, at least a portion of which is recessed into the respective dielectric layer; and where the at least one conductive structure may include an edge plating disposed on at least a portion of the recessed edge included on the portion of the plurality of dielectric layers.

According to example 21, there is provided a method of forming a semiconductor package side-radiating waveguide launcher. The method may include: forming a first conductive member proximate an edge of a dielectric medium having a thickness; forming a second conductive member proximate the edge of the dielectric medium and transversely opposed across the thickness of the dielectric medium to the first conductive member; conductively coupling the first conductive member with the second conductive member using at least one conductive structure forming a shaped space in the dielectric medium; the shaped space having a first end and an opposed second end; and disposing at least one radio frequency (RF) excitation element at a location within the dielectric medium electrically isolated from the first conductive member, the second conductive member, and the conductive structure.

Example 22 may include elements of example 21 where conductively coupling the first conductive member with the second conductive member using at least one conductive structure forming a shaped space in the dielectric medium may include: conductively coupling the first conductive member with the second conductive member using at least one conductive structure forming a shaped space in the dielectric medium, wherein the shaped space comprises a shaped space bilaterally symmetric about a longitudinal axis extending from the first end of the space to the second end of the space.

Example 23 may include elements of example 22 where conductively coupling the first conductive member with the second conductive member using at least one conductive structure may include: conductively coupling the first conductive member with the second conductive member using at least one conductive structure forming a shaped space in the dielectric medium; the shaped space having a relatively narrow first end and an opposed relatively wide second end.

Example 24 may include elements of example 21 where disposing at least one radio frequency (RF) excitation element at a location within the dielectric medium may include: disposing at least one radio frequency (RF) excitation element at a location internal to the shaped space formed by the conductive structure.

Example 25 may include elements of example 21 where disposing at least one radio frequency (RF) excitation element at a location within the dielectric medium may include: disposing at least one radio frequency (RF) excitation element at a location at a location external to the shaped space formed by the conductive structure.

Example 26 may include elements of example 21 where conductively coupling the first conductive member with the second conductive member via at least one conductive structure may include: conductively coupling the first conductive member with the second conductive member using a plurality of conductive members arranged in a pattern that forms the shaped space and extends transversely through the dielectric medium.

Example 27 may include elements of example 26 where conductively coupling the first conductive member with the second conductive member using a plurality of conductive members arranged in a pattern that forms the shaped space and extends transversely through the dielectric medium further may include: conductively coupling the first conductive member with the second conductive member using a plurality of thru-layer vias arranged in a pattern that forms at least a portion of the shaped space and extends transversely through the dielectric medium.

Example 28 may include elements of example 21 where forming a first conductive member proximate an edge of a dielectric medium may include: forming the first conductive member proximate an edge of a dielectric medium that includes a plurality of dielectric layers; and where forming a second conductive member proximate the edge of the dielectric medium may include: forming the second conductive member proximate the edge of the dielectric medium that includes the plurality of dielectric layers.

Example 29 may include elements of example 28 where forming the first conductive member proximate an edge of a dielectric medium that includes a plurality of dielectric layers may include: forming the first conductive member proximate an edge of a dielectric medium that includes the plurality of dielectric layers wherein at least one dielectric layer includes an edge having a recessed portion; where forming the second conductive member proximate an edge of a dielectric medium that includes a plurality of dielectric layers may include: forming the second conductive member proximate the edge of the dielectric medium that includes the plurality of dielectric layers wherein at least one dielectric layer includes the edge having the recessed portion; and where conductively coupling the first conductive member with the second conductive member via at least one conductive structure may include: disposing edge plating on at least a portion of the recessed edge portion of the at least one dielectric layer to conductively couple the first conductive member with the second conductive member.

Example 30 may include elements of any of examples 21 through 29, and may additionally include operably coupling a waveguide mounting structure proximate the second end of the shaped space.

Example 31 may include elements of example 21 where forming a first conductive member proximate an edge of a dielectric medium having a thickness may include: patterning the first conductive member on the dielectric material.

Example 32 may include elements of example 21 where forming a second conductive member proximate an edge of a dielectric medium having a thickness may include: patterning the second conductive member on the dielectric material.

Example 33 may include elements of example 21 where disposing at least one RF excitation element at a location within the dielectric medium may include: disposing a microwave excitation element at a location within the dielectric medium.

According to example 34, there is provided a system for forming a semiconductor package side-radiating waveguide launcher. The system may include: a means for forming a first conductive member proximate an edge of a dielectric medium having a thickness; a means for forming a second conductive member proximate the edge of the dielectric medium and transversely opposed across the thickness of the dielectric medium to the first conductive member; a means for conductively coupling the first conductive member with the second conductive member using at least one conductive structure forming a shaped space in the dielectric medium; the shaped space having a first end and an opposed second end; and a means for disposing at least one radio frequency (RF) excitation element at a location within the dielectric medium electrically isolated from the first conductive member, the second conductive member, and the conductive structure.

Example 35 may include elements of example 34 where the means for conductively coupling the first conductive member with the second conductive member using at least one conductive structure forming a shaped space in the dielectric medium may include a means for conductively coupling the first conductive member with the second conductive member using at least one conductive structure forming a shaped space in the dielectric medium, wherein the shaped space comprises a shaped space bilaterally symmetric about a longitudinal axis extending from the first end of the space to the second end of the space.

Example 36 may include elements of example 35 where the means for conductively coupling the first conductive member with the second conductive member using at least one conductive may include: a means for conductively coupling the first conductive member with the second conductive member using at least one conductive structure forming a shaped space in the dielectric medium; the shaped space having a relatively narrow first end and an opposed relatively wide second end.

Example 37 may include elements of example 34 where the means for disposing at least one RF excitation element at a location within the dielectric medium may include: a means for disposing at least one RF excitation element at a location internal to the shaped space formed by the conductive structure.

Example 38 may include elements of example 34 where disposing at least one RF excitation element at a location within the dielectric medium may include: a means for disposing at least one RF excitation element at a location at a location external to the shaped space formed by the conductive structure.

Example 39 may include elements of example 34 where the means for conductively coupling the first conductive member with the second conductive member via at least one conductive structure may include: a means for conductively coupling the first conductive member with the second conductive member using a plurality of conductive members arranged in a pattern that forms the shaped space and extends transversely through the dielectric medium.

Example 40 may include elements of example 39 where the means for conductively coupling the first conductive member with the second conductive member using a plurality of conductive members arranged in a pattern that forms the shaped space and extends transversely through the dielectric medium further may include: a means for conductively coupling the first conductive member with the second conductive member using a plurality of thru-layer vias arranged in a pattern that forms at least a portion of the shaped space and extends transversely through the dielectric medium.

Example 41 may include elements of example 34 where the means for forming a first conductive member proximate an edge of a dielectric medium may include: a means for forming the first conductive member proximate an edge of a dielectric medium that includes a plurality of dielectric layers; and where the means for forming a second conductive member proximate the edge of the dielectric medium may include: a means for forming the second conductive member proximate the edge of the dielectric medium that includes the plurality of dielectric layers.

Example 42 may include elements of example 41 where the means for forming the first conductive member proximate an edge of a dielectric medium that includes a plurality of dielectric layers may include: a means for forming the first conductive member proximate an edge of a dielectric medium that includes the plurality of dielectric layers wherein at least one dielectric layer includes an edge having a recessed portion; where the means for forming the second conductive member proximate an edge of a dielectric medium that includes a plurality of dielectric layers may include: a means for forming the second conductive member proximate the edge of the dielectric medium that includes the plurality of dielectric layers wherein at least one dielectric layer includes the edge having the recessed portion; and where the means for conductively coupling the first conductive member with the second conductive member via at least one conductive structure may include: a means for disposing edge plating on at least a portion of the recessed edge portion of the at least one dielectric layer to conductively couple the first conductive member with the second conductive member.

Example 43 may include elements of any of examples 34 through 42, and may additionally include a means for operably coupling a waveguide mounting structure proximate the second end of the shaped space.

Example 44 may include elements of example 44 where the means for forming a first conductive member proximate an edge of a dielectric medium having a thickness may include: a means for patterning the first conductive member on the dielectric material.

Example 45 may include elements of example 34 where the means for forming a second conductive member proximate an edge of a dielectric medium having a thickness may include: a means for patterning the second conductive member on the dielectric material.

Example 46 may include elements of example 34 where the means for disposing at least one RF excitation element at a location within the dielectric medium may include: a means for disposing a microwave excitation element at a location within the dielectric medium.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A semiconductor package side-radiating waveguide launcher system, comprising:
    a first conductive member adjacent to an edge of a dielectric medium having a thickness;
    a second conductive member adjacent to the edge of the dielectric medium and in transverse opposition across the thickness of the dielectric medium to the first conductive member;
    a plurality of conductive structures conductively coupling the first conductive member with the second conductive member, the plurality of conductive structures forming a shaped space in the dielectric medium, the shaped space having a first end and an opposing second end, the second end wider than the first end, and the second end laterally opposite the first end, wherein the second end is closer to the edge of the dielectric medium and than the first end; and
    at least one radio frequency (RF) excitation element at a location within the dielectric medium and entirely outside of the shaped space, the at least one RF excitation element electrically isolated from the first conductive member, the second conductive member, and the plurality of conductive structures.

2. The semiconductor package side-radiating waveguide launcher system of claim 1:

wherein the shaped space is bilaterally symmetric about a longitudinal axis extending from the first end of the shaped space to the second end of the shaped space.

3. The semiconductor package side-radiating waveguide launcher system of claim 1 wherein the dielectric medium comprises a plurality of dielectric layers.

4. The semiconductor package side-radiating waveguide launcher system of claim 3: wherein at least a portion of the edge of the dielectric medium is recessed into the dielectric medium; and wherein at least one conductive structure of the plurality of conductive structures comprises an edge plating disposed on at least a portion of the recessed edge of the dielectric medium.

5. The semiconductor package side-radiating waveguide launcher system of claim 2, further comprising: a waveguide mounting structure at the second end of the shaped space.

\* \* \* \* \*